US 9,905,489 B2

(12) United States Patent
Mitsumoto et al.

(10) Patent No.: US 9,905,489 B2
(45) Date of Patent: Feb. 27, 2018

(54) SEMICONDUCTOR DEVICE AND ELECTRICAL DEVICE

(71) Applicant: FUJI ELECTRIC CO., LTD., Kanagawa (JP)

(72) Inventors: Takahiro Mitsumoto, Matsumoto (JP); Akira Iso, Kai (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/219,303

(22) Filed: Jul. 26, 2016

(65) Prior Publication Data

US 2017/0084508 A1   Mar. 23, 2017

(30) Foreign Application Priority Data

Sep. 17, 2015 (JP) .................. 2015-184159

(51) Int. Cl.
*H01L 23/12* (2006.01)
*H01L 23/04* (2006.01)
*H01L 23/24* (2006.01)

(52) U.S. Cl.
CPC .............. *H01L 23/04* (2013.01); *H01L 23/24* (2013.01)

(58) Field of Classification Search
CPC ..... H01L 23/04; H01L 23/043; H01L 23/045; H01L 23/047; H01L 23/3121; H01L 23/021; H01L 23/02–23/10; H01L 2924/161
USPC ......................... 257/687, 704, 706
See application file for complete search history.

(56) References Cited

U.S. PATENT DOCUMENTS

| | | | | |
|---|---|---|---|---|
| 5,789,813 A * | 8/1998 | Kirkland | ............. | H01L 23/4093 257/712 |
| 5,949,137 A * | 9/1999 | Domadia | ............ | H01L 23/4006 257/213 |
| 6,025,732 A * | 2/2000 | Foo | ...................... | G01R 1/0483 324/750.05 |
| 6,515,360 B2 * | 2/2003 | Matsushima | ........... | H01L 23/10 257/704 |
| 2002/0163065 A1 * | 11/2002 | Kuwahara | ............... | H01L 23/10 257/678 |
| 2006/0197215 A1 * | 9/2006 | Potter | ................. | B81C 1/00269 257/704 |

FOREIGN PATENT DOCUMENTS

JP        H11-17069 A        1/1999

* cited by examiner

*Primary Examiner* — Kevin M Picardat

(57) ABSTRACT

A semiconductor device is provided comprising a semiconductor element, a case portion housing the semiconductor element and having an opening end on at least some of wall portion, a lid portion covering the opening end of the case portion, and a sealing material sealing the semiconductor element inside the case portion, where a projection portion or a dent portion is provided on a surface of the wall portion close to the sealing material between the opening end and the sealing material. The Purpose is to prevent an oil leakage from a semiconductor device. Also, instead of the projection portion or the dent portion, a semiconductor device is provided with a liquid receiving portion that receives a liquid dripping from the opening end on a surface facing away from the sealing material.

15 Claims, 20 Drawing Sheets

(A)  (B)  (C)

(D)  (E)  (F)

US 9,905,489 B2

SEMICONDUCTOR DEVICE AND ELECTRICAL DEVICE

The contents of the following Japanese patent application are incorporated herein by reference:
NO. 2015-184159 filed in JP on Sep. 17, 2015

BACKGROUND

1. Technical Field

The present invention relates to a semiconductor device and an electrical device.

2. Related Art

A sealing material such as resin or silicone gel is enclosed inside a semiconductor device for the purpose of insulation between circuits provided inside the semiconductor device (for example, refer to Patent Document 1).

Patent Document 1: Japanese Patent Application Publication No. H11-17069

SUMMARY

Depending on the type of the sealing material, an oil component in a trace amount included in components of the sealing material leaches from the sealing material after curing and leaks to the outside of the semiconductor device in some cases. In particular, in an electrical device equipped with a semiconductor device, in a case where the semiconductor device is equipped at an angle such as equipped on a vertical surface, not in a case of being equipped on a normal flat surface, the leakage of the oil component to the outside becomes significant.

In a first aspect of the present invention, provided is a semiconductor device provided with a semiconductor element, a case portion that houses the semiconductor element and has an opening end at least some of wall portions, a lid portion that covers the opening end of the case portion, and a sealing material that seals the semiconductor element inside the case portion, where a projection portion or a dent portion is provided on a surface on the sealing material side of the wall portion between the opening end and the sealing material side.

In a second aspect of the present invention, provided is a semiconductor device provided with a semiconductor element, a case portion that houses the semiconductor element and has an opening end at least on some of wall portions, a lid portion that covers the opening end of the case portion, and a sealing material that seals the semiconductor element inside the case portion, where a liquid receiving portion receives a liquid dripping from the opening end on a surface of the wall portion having the opening end, the surface facing away from the sealing material.

In a third aspect of the present invention, provided is an electrical device provided with the above-described semiconductor device such that the opening end is positioned lower than at least a part of the sealing material.

It should be noted that the above-described invention summary does not necessarily describe all features of the present invention. Also, a sub-combination of these features may also be the present invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1:
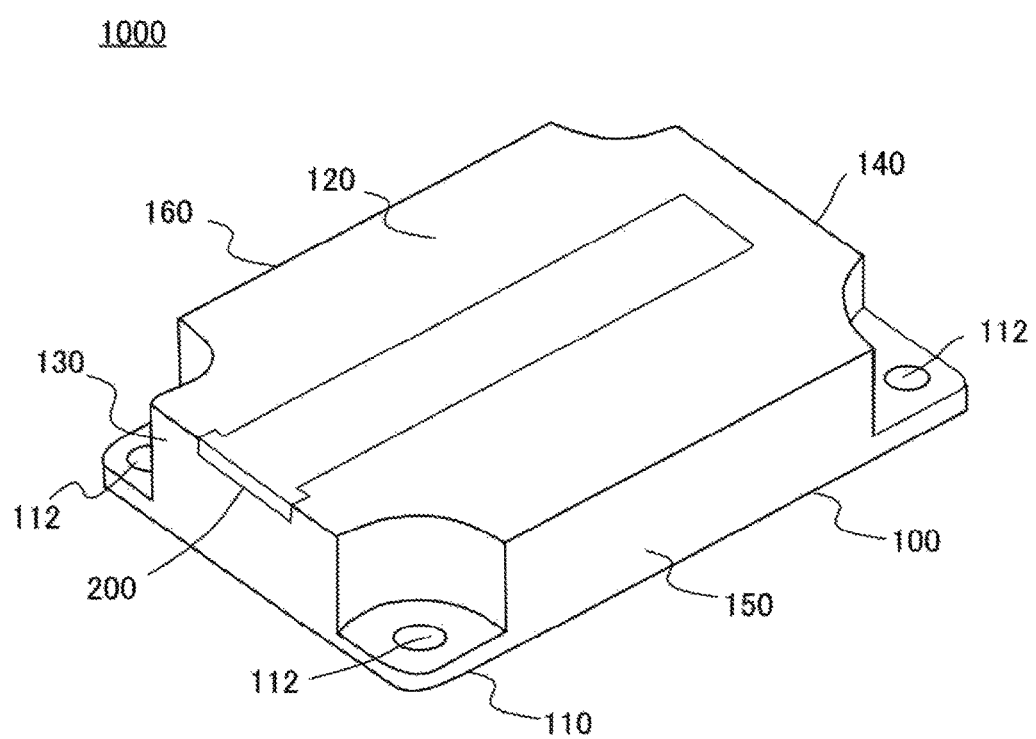
FIG. 1 shows a perspective view of a semiconductor device 1000 in a first embodiment.

FIG. 1 is a perspective view of a semiconductor device 1000 in a first embodiment. The semiconductor device 1000 includes a case portion 100 and a lid portion 200. The case portion 100 has a space inside. A semiconductor element, a sealing material sealing the semiconductor element, and the like are housed in the space of the case portion 100. The semiconductor device 1000 in the present example is a power module having an IGBT as the semiconductor element. The sealing material is, for example, silicone gel and the like.

The case portion 100 has an approximately rectangular parallelepiped shape, and has a bottom wall 110 and an upper wall 120 which are opposite to each other, and four outer walls 130, 140, 150 and 160. The bottom wall 110, the upper wall 120, the outer wall 130, the outer wall 140, the outer wall 150 and the outer wall 160 of the case portion 100 may each be referred to as a wall portion. The shape of each wall portion is not limited to the plate-like structure illustrated. Each wall portion may have a plate-like shape, a curved-shape, a waved-shape, etc. or their combinations. The case portion may be formed by a plurality of wall portions having the same or different shapes, or formed by a substantially-continuous wall portion. The horizontal sectional view of the outer shape of the case portion may be cylindrical, polygonal, etc.

The case portion 100 is, as one example, formed of a heat-resistant resin such as epoxy resin. The outer walls 130 and 140 are opposite to each other, and the outer wall 150 and the outer wall 160 are opposite to each other. For example, the respective walls are formed integrally. As one example, the bottom wall 110 has an opening and a heat releasing board fitted in the opening. The heat releasing board and the walls made of resin are fixed with an adhesive. Also, the bottom wall 110 is provided with four installation holes 112 at its four corners. After curing the sealing material, the semiconductor device 1000 is fixed in a usage position of various types of electrical devices.

In any of the wall portions, a through hole covered by the lid portion 200 is provided. The through hole penetrates the wall portion from the outer side to the inner side of the case portion 100. In the present example, the through hole is formed in the upper wall 120 and the outer wall 130. More specifically, a rectangular through hole is formed extending from a side of the upper wall 120, the side in contact with the outer wall 130, toward the central portion of the upper wall 120. The lid portion 200 in the present example is slid in the inner side the upper wall 120 from the side of the upper wall 120 in contact with the outer wall 130 and is inserted in the upper wall 120 and the outer wall 130. Thereby, the lid portion 200 blocks the through hole of the upper wall 120 and the outer wall 130. It should be noted that the boundary surfaces between the lid portion 200 and the case portion 100 are not adhesive such that the lid portion 200 is openable for the reasons of assembling or maintenance and the like.

Figure 2:
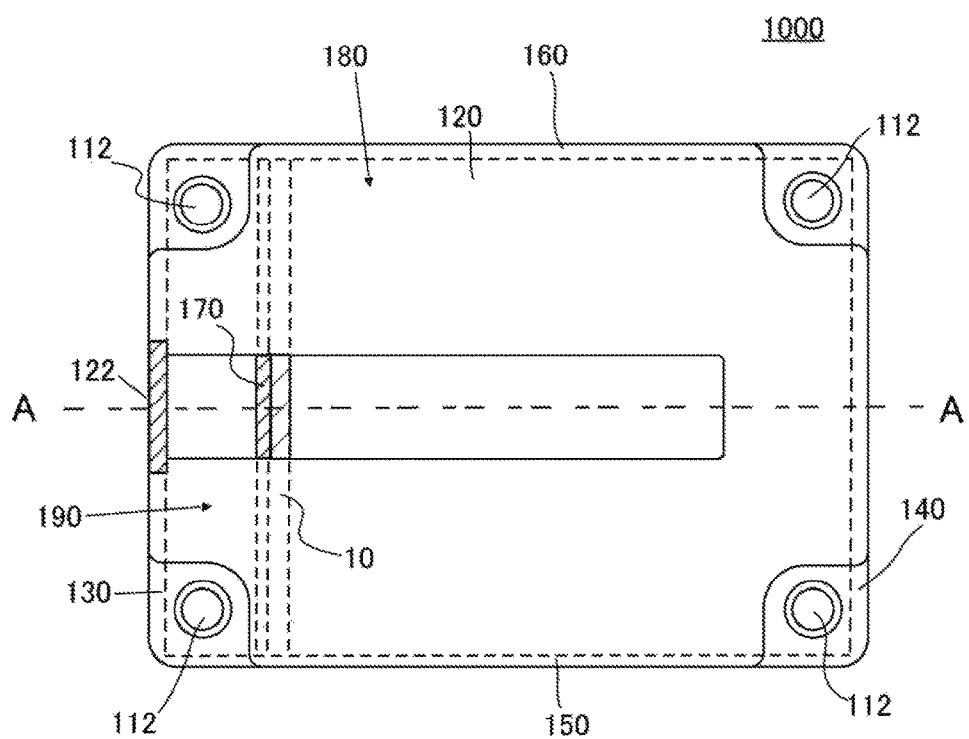
FIG. 2 shows a top surface view of the semiconductor device 1000.

FIG. 2 is a top surface view of the case portion 100. In FIG. 2, the case portion 100 in a state that the lid portion 200 is not inserted therein is shown. Also, in FIG. 2, a resin structure inside the case portion 100 is shown by the dashed lines.

The case portion 100 in the present example has an inner wall 170 provided approximately perpendicular relative to the bottom wall 110. The inside space of the case portion 100 is partitioned into two rooms 180 and 190 by the inner wall 170. The inner wall 170 in the present example is connected with the upper wall 120 by a region excluding the through hole. It should be noted that the inner wall 170 is also one example of the wall portion.

Figure 3:
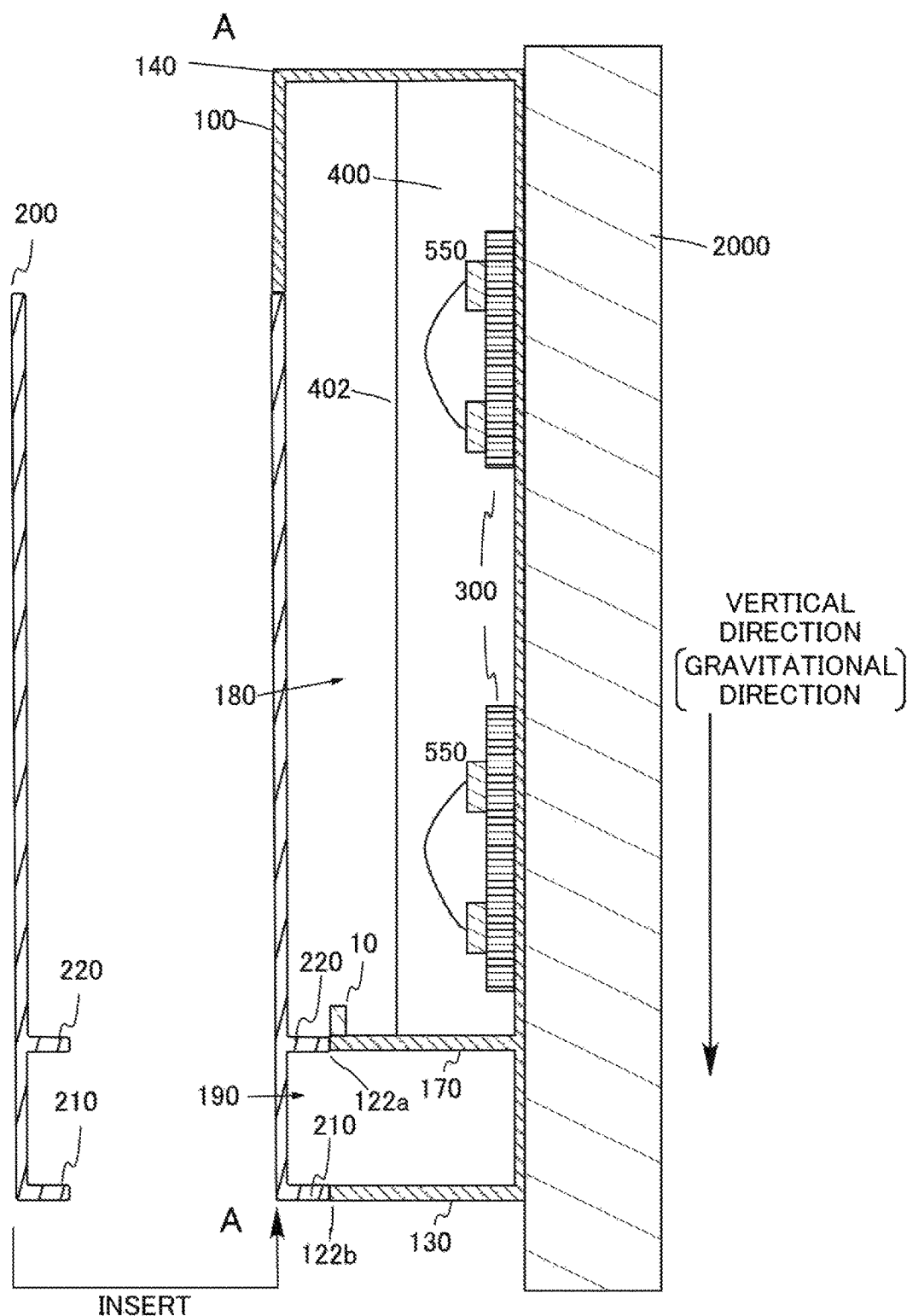
FIG. 3 shows a cross section view of the semiconductor device 1000 and a wall 2000 of an electrical device.

FIG. 3 is a drawing showing an A-A cross section in FIG. 2 along with a cross section of a wall 2000 of the electrical device where the semiconductor device 1000 is provided. It should be noted that FIG. 3 shows the lid portion 200 before inserting and the semiconductor device 1000 in a state that the lid portion 200 is inserted therein. It should be noted that the electrical device refers to a device having electrical circuits. The semiconductor device 1000 is included in the electrical circuits. As one example of the electrical device, there are an automobile, a generator, an industrial robot and the like.

As described above, the case portion 100 is partitioned into the two rooms 180 and 190 inside by the inner wall 170 provided approximately perpendicularly to the bottom wall 110. Four side surfaces surrounding the room 180 are defined by the outer walls 130, 150 and 160 and the inner wall 170. Side surfaces surrounding the room 190 are defined by the outer walls 140 and 150, the outer wall 160 and the inner wall 170. The inner wall 170 in the present example is provided approximately parallel to the outer wall 130 and the outer wall 140.

A base portion 300 is arranged on the bottom wall 110 in the room 180. The base portion 300 is, for example, a DCB (Direct Copper Bonding) substrate. A semiconductor element 550 is arranged on the base portion 300. A sealing material 400 is poured inside the room 180. The sealing material 400 is formed so as to cover at least the semiconductor element 550. Also, the sealing material 400 covers wirings provided above the semiconductor element 550, too. The sealing material 400 is, for example, silicone gel including an oil component. The sealing material 400 is cured after pouring inside the room 180 in the case portion 100 which is in a state of being horizontal. Thereby, the sealing material 400 seals the semiconductor element 550 inside the case portion 100. No substrate or element is arranged in the room 190 in the present example. In another example, a semiconductor element or a wiring and the like may be also arranged in the room 190. In this case, it is preferable to form the sealing material also inside the room 190.

The semiconductor device 1000 in the present embodiment includes an opening end 122 at least on some of wall portions. Also, the semiconductor device 1000 is provided in an electrical device such that the opening end 122 is positioned lower than at least a part of the sealing material 400. As one example, the semiconductor device 1000 is arranged such that the bottom wall 110 is in contact with the wall 2000 which extends in the vertical direction (gravitational direction) shown by the arrow. It should be noted that the vertical direction (gravitational direction) may be shown by an arrow in drawings after this.

In the present example, an opening end 122*a* is arranged on the inner wall 170, and an opening end 122*b* is arranged on the outer wall 130. The respective opening ends are formed by cutting a part of the walls. As the lid portion 200 is slidably inserted in the through hole of the upper wall 120, the opening end 122*b* and the opening end 122*a* respectively engage with a corner portion 210 of the lid portion 200 and an end portion 220 of the lid portion 200. The lid portion 200 and the opening end 122 are designed to accurately engage with each other, and the lid portion 200 covers the opening end 122*a* and the opening end 122*b*. However, slight gaps may be created between the opening end 122*a* and the lid portion 200 and between the opening end 122*b* and the lid portion 200 due to influences of tolerance or thermal expansion and the like.

A trace amount of oil components is included in the sealing material inside the case portion 100 in some cases. This oil component leaches even from the sealing material after curing. As described above, since the boundary surfaces between the lid portion 200 and the case portion 100 are not adhesive, once the oil component leaches from the sealing material, the oil component leaks from the boundary surfaces between the lid portion 200 and the case portion 100 to the outside of the semiconductor device 1000 in some cases. For example, if at least a part of the through hole of the wall portion is provided on a lower side of the sealing material in the gravitational direction, the oil component having leached from the sealing material may leak to the outside of the semiconductor device 1000 through the boundary surfaces between the lid portion 200 and the case portion 100. More specifically, the oil component flows from the room 180 to the room 190 along the opening end 122*a* of the inner wall 170, and further outflows to the outside along the opening end 122*b* of the outer wall 130 in some cases.

Unlike leakage of the main gel component, this leakage of the oil component does not affect the insulation performance and the like of the semiconductor device 1000. However, in some cases the leached oil component causes problems such as deterioration of other electronic circuits of the electrical device, which are arranged around the semiconductor device 1000.

Then, the semiconductor device 1000 in the present embodiment is configured such that a projection portion or a dent portion is provided on the wall portion, which prevents the oil component from reaching the boundary surfaces between the lid portion 200 and the case portion 100 inside the case portion 100. Specifically, the outflow of the oil component is prevented by providing a projection portion or a dent portion on a surface of the wall portion close to the sealing material 400 (the inner wall 170, the outer wall 130) between the opening end 122 and the sealing material 400.

As described above, the wall portion includes the upper wall, the bottom wall, the outer wall and the inner wall which form the case portion 100. Also, the opening end of the wall portion refers to any end portion of a wall portion which has a possibility of leakage of oil component in a case where a semiconductor device is arranged in a certain usage environment (such as an arrangement direction, physical influences caused by a temperature change, a vibration, acceleration and/or the like, or external pressures, contacts and/or changes with age) or in a case where a usage environment changes. Although the opening ends 122*a* and 122*b* of the case portion 100 in the present example are structures made from the perspective of design for engaging with the lid portion 200, the opening ends according to the present invention are not limited to such intended structures. Portions added and/or changed after manufacturing for purpose of maintenance or repair, gaps created due to the deterioration with age or the temperature change, and the like also referred to as the opening ends as long as they are the portions where the oil component leaks out. Although the case portion 100 in the present example has a linear opening end, the opening end may be in a curved shape, and may be a hole formed on a wall portion or a gap caused by the peeled adhesive. A plurality of opening ends having different shapes may be formed on one or more wall portions.

As one example, the wall portion between the opening end and the sealing material refers to a part of one or more regions of one or more wall portions, where the one or more regions pass through from the wall portion contacting with the seal member toward the opening end in the shortest distance along one or more surfaces of the one or more wall portions. The projection portion or the dent portion is preferably the wall portion between the opening end and the sealing material and formed in a region closer to the opening end 122 than the sealing material 400. In particular, from the perspective of minimizing the area where the oil component leaks and spreads, it is preferable to provide a projection portion 10 or a dent portion in the wall portion that is in contact with the sealing material 400 (in the present example, the inner wall 170).

By using the following FIG. 4 to FIG. 21, an embodiment of providing the projection portion or the dent portion in the inner wall 170 that is in contact with the sealing material 400 will be described.

First Example

Figure 4:
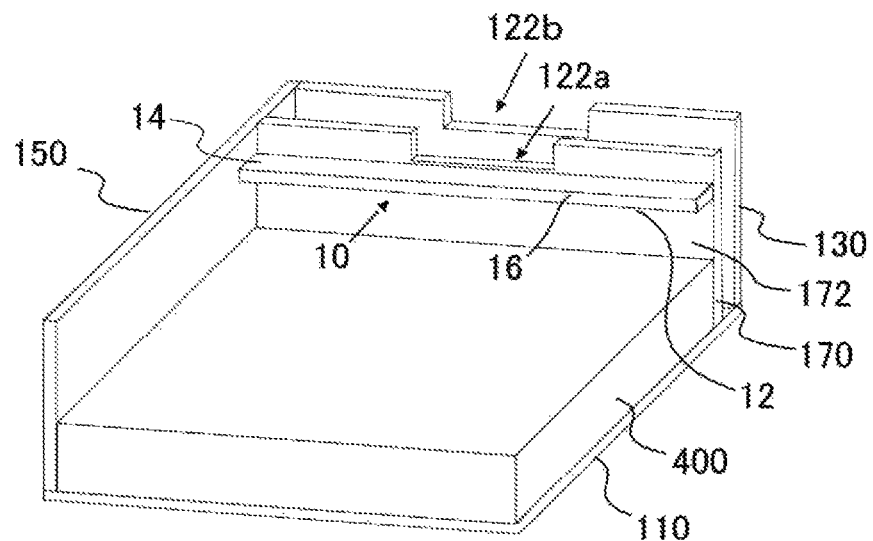
FIG. 4 shows a partial perspective view of a case portion 100 in a first example.
Figure 5:
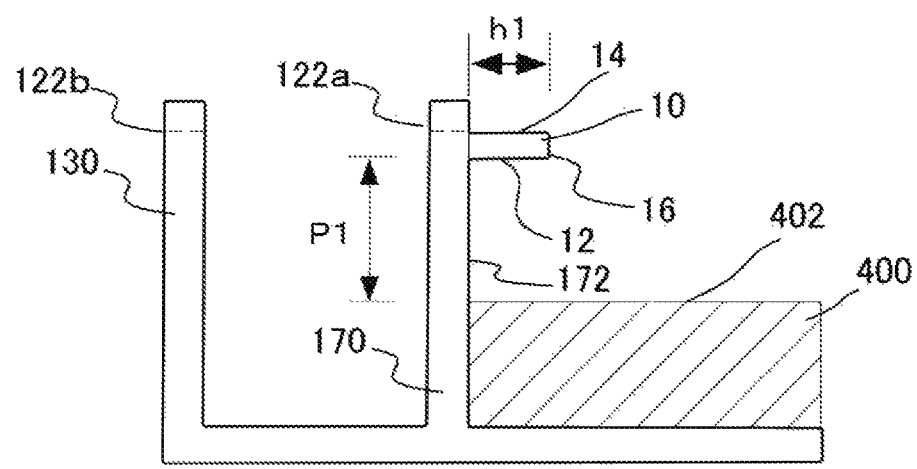
FIG. 5 shows a side view of FIG. 4.

In FIG. 4, a partial perspective view of the case portion 100 in a first example, where a projection portion 10 is provided on the inner wall 170 that is in contact with the sealing material 400, is shown. In FIG. 5, a side view of FIG. 4 is shown. It should be noted that in order to be easily understood, in FIG. 4, the upper wall 120, the outer wall 140 and the outer wall 160 are not shown.

The projection portion 10 in the present example has an eaves shape. The projection portion 10 is provided on a surface of the inner wall 170 and between the opening end 122*a* and a surface 402 of the sealing material 400. The projection portion 10 in the present example extends along the opening end 122*a* in the width direction of the inner wall 170. The width direction of the inner wall 170 refers to, for example, a direction vertical to the surface of the outer wall 150.

As shown in FIG. 5, the projection portion 10 has a side surface 12 close to the sealing material 400, a side surface 14 far from the sealing material 400, and an end surface 16 connecting the side surface 12 and the side surface 14. The side surface 12 and the side surface 14 are respectively in contact with a surface 172 and the end surface 16, and the end surface 16 is in contact with the side surface 12 and the side surface 14. In the present example, the side surface 12 and the side surface 14 are approximately parallel to each other and are formed as flat surfaces in approximately the same shapes as and approximately parallel to the surface 402 of the sealing material 400 after curing.

The projection portion 10 is provided between the opening end 122*a* and the surface 402 of the sealing material 400 and in the vicinity of the opening end 122*a*. In the present example, the side surface 14 is provided so as to be in contact with the opening end 122*a*. Here, the phrase "provided so as to be in contact with the opening end" refers to that the distance from the opening end 122*a* is in a range no less than 0 mm and no greater than 5 mm. The distance is preferably no greater than 2.0 mm, and more preferably no greater than 1.0 mm.

Furthermore, the projection portion 10 is arranged continuously between the opening end and the sealing material 400 over an area at least wider than the opening end 122*a*. For example, the width of the projection portion 10 is longer than the width of the opening end 122*a*. In the present example, the projection portion 10 is arranged linearly from one end of the inner wall 170 where the inner wall 170 is in contact with the outer wall 150 to the other end of the inner wall 170 where the inner wall 170 is in contact with the outer wall 160 along the width direction of the inner wall 170.

It should be noted that a protruding surface of the projection portion 10 is one of the surfaces forming the projection portion 10 that includes the highest portion of the projection portion 10 among the surfaces forming the projection portion 10 and is the surface closest to the sealing material 400. It should be noted that the highest portion of the projection portion 10 is a portion of the projection portion 10 positioned in the farthest position from the wall portion where the projection portion 10 is formed, in a direction parallel to the surface 402 of the sealing material 400. In the present example, the height h1 of the projection portion 10 is the distance from the surface 172 of the inner wall 170 close to the sealing material 400 to the end surface 16. As one example, the height h1 of the projection portion 10 is in a range no less than 1.0 mm and no greater than 5.0 mm. The lower limit of the height h1 may be 2.0 mm or may be 3.0 mm.

The projection portion 10 is, as one example, formed integrally with the case portion 100. In another example, the projection portion 10 is installed by fusing processing or using adhesive and the like, after forming the case portion 100. In this case, the projection portion 10 may be installed before or after the sealing material 400 is enclosed.

In this way, the projection portion 10 is arranged so as to protrude from the inner wall 170, approximately parallel to the surface 402 of the sealing material 400. For this reason, the oil component leached from the sealing material 400 can be prevented from outflowing from the opening end 122a.

Also, by adjusting the height of the projection portion 10 and the position of the projection portion 10, the amount of the oil component stored by the projection portion 10 can be regulated. A position P1 of the projection portion 10 can be, as one example, defined as the distance from the surface 402 of the sealing material 400 to the projection portion 10, or the distance from the opening end 122a to the projection portion 10. The position P1 and the height h1 of the projection portion 10 can be determined in accordance with the amount (weight or volume) of the used sealing material 400 or the amount (weight or volume) of the oil component included in the used sealing material 400.

In the present example, although the projection portion 10 is arranged such that the side surface 14 is in contact with the opening end 122a, the projection portion 10 may be arranged in any position of the inner wall 170 as long as the projection portion 10 is provided at the position between the opening end 122a and the surface 402 of the sealing material 400. For example, the projection portion 10 may be arranged at a position closer to the opening end 122a than the surface 402 of the sealing material 400. In another example, it is possible to be arranged at a position closer to the surface 402 of the sealing material 400 than the opening end 122a.

On the other hand, if the projection portion 10 is arranged such that the side surface 14 is in contact with the opening end 122a, the position of the projection portion 10 can be made farthest from the surface 402 of the sealing material 400. For that reason, the amount of the oil component which can be stored can be largest assuming that the height of the projection portion 10 is fixed. That is, arranging the projection portion 10 such that the side surface 14 is in contact with the opening end 122a is effective for a case where a large amount of the oil component is included in the used sealing material 400.

In this way, in the present example, by providing the projection portion 10 on the inner wall 170, the oil component can be dammed and stored in the room 180. For that reason, the outflow of the oil component to the outside of the semiconductor device can be prevented. Also, even if the oil component outflows, the outflow amount can be reduced.

Figure 6:
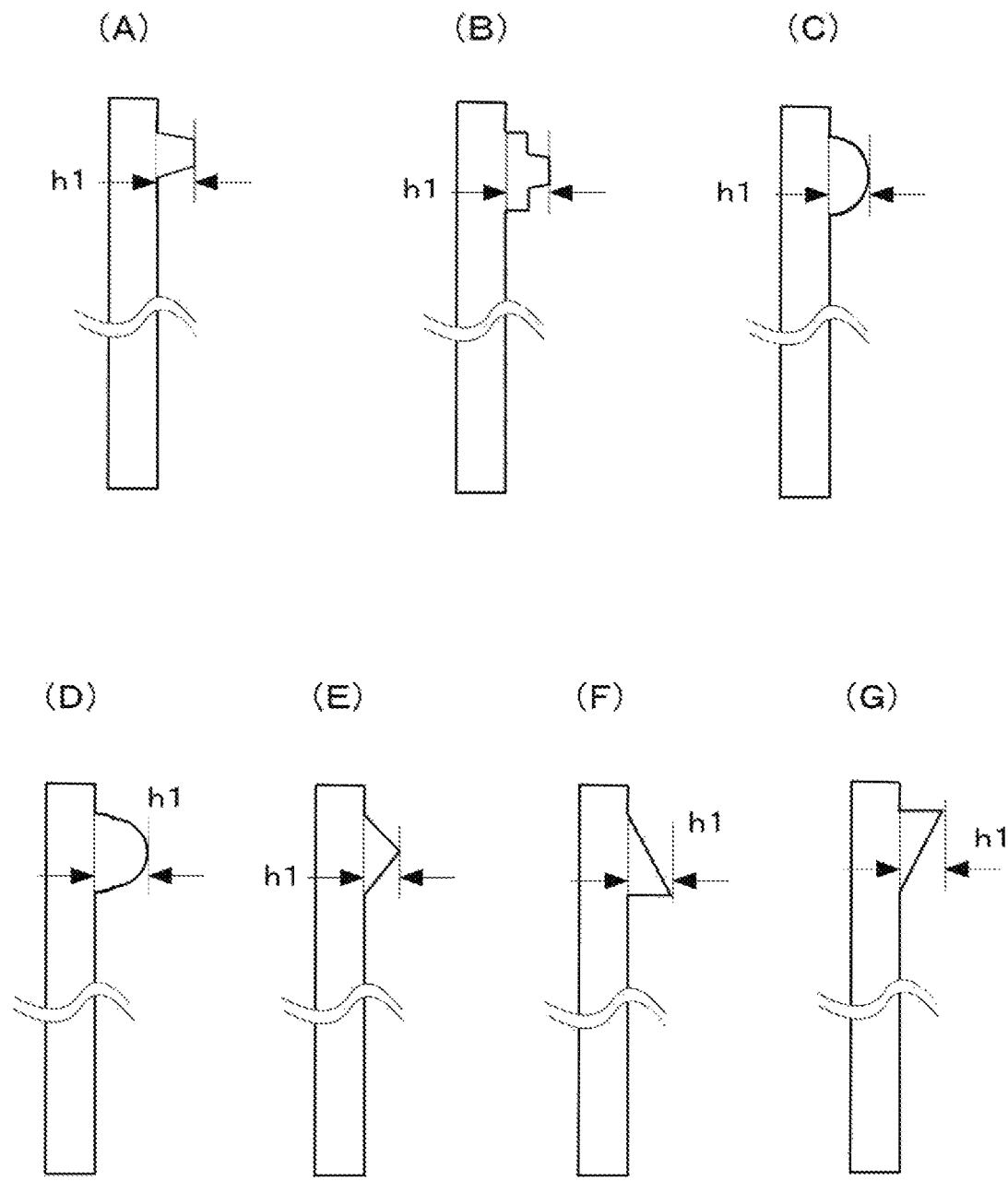
FIG. 6 shows a variation of a cross sectional shape of a projection portion 10.

In (A) to (G) in FIG. 6, variations of cross sectional shapes of the projection portion are shown. The projection portion may be formed in a trapezoidal shape ((A) in FIG. 6), a step shape or a pyramid shape ((B) in FIG. 6), a semicircular shape ((C) in FIG. 6), a shape of non-circular curve ((D) in FIG. 6), a triangular pyramid-shaped whose vertex is present in the center ((E) in FIG. 6), a triangular pyramid-shaped whose vertex is present facing away from the opening end ((F) in FIG. 6), or a triangular pyramid-shaped whose vertex is present on the opening end side ((G) in FIG. 6). The projection portion may be also formed in a combination of these multiple shapes. For example, the projection portion may be further formed on the end surface 16 shown in FIG. 4. Also, the projection portion may be formed such that the size of its cross sectional shape changes along the extending direction of the projection portion.

The projection portion 10 illustrated in FIG. 4 and FIG. 5 extends linearly in the width direction of the inner wall 170. On the other hand, in another example, the projection portion 10 may also have a shape such as being convexly curved toward the upper wall 120 (that is, recessedly curved toward the bottom wall 110), convexly curved toward the bottom wall 110 (that is, recessedly curved toward the upper wall 120) or convexes/recesses repeatedly formed. Furthermore, these convexes/recesses may be formed as a straight line or a curve. The projection portion 10 may be formed so as to surround the opening end 122, not extending in the entire width direction of the inner wall 170. Furthermore, a plurality of projection portions 10 may be provided. In that case, the heights of the respective projection portions 10 may differ from each other. The heights of the plurality of the projection portions 10 may become larger as being closer to the opening end 122. Also, the cross sectional shape of the projection portion 10 may change in accordance with the positions in the extending direction of the projection portion 10. In this case, the shape may be changed by enlarging or reducing a fixed shape or may be changed continuously from a certain shape to another shape.

Second Example

Figure 7:
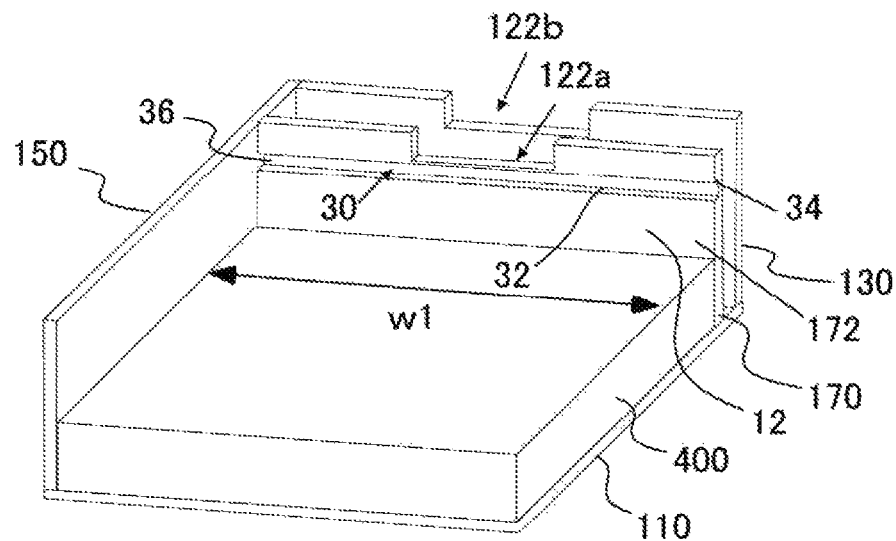
FIG. 7 shows a partial perspective view of the case portion 100 in a second example.
Figure 8:
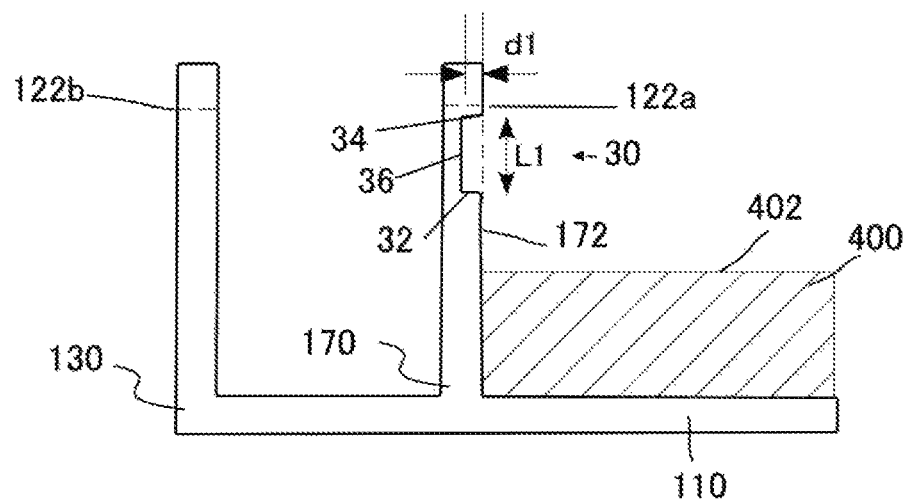
FIG. 8 shows a side view of FIG. 7.

In FIG. 7, a partial perspective view of the case portion 100 in a second example, where a dent portion 30 is provided on the inner wall 170 that is in contact with the sealing material 400, is shown. In FIG. 8, a side view of FIG. 7 is shown. It should be noted that in order to be easily understood, the upper wall 120, the outer walls 140 and 160 are not shown in FIG. 7.

The structure of the case portion 100 is the same as the structure described in FIGS. 1 to 3, except the below-described point. In the present example, the dent portion 30 is provided on a surface 172 of the inner wall 170 facing the sealing material 400 between the opening end 122a and the sealing material 400.

The dent portion 30 of the present example has a rectangular shape in a cross section vertical to the extending direction of the dent portion 30. Also, the dent portion 30 extends along the opening end 122a in the width direction of the inner wall 170. The dent portion 30 has a side surface 32 close to the sealing material 400, a side surface 34 far from the sealing material 400, and an end surface 36 connecting the both side surfaces. The side surface 32 and the side surface 34 connect the surface 172 to the end surface 36. The end surface 36 connects the side surface 32 to the side surface 34. In the present example, the side surface 32 and the side surface 34 are parallel to each other and are formed as flat surfaces in approximately the same shapes, approximately parallel to the surface of the sealing material 400 after curing.

The dent portion 30 is provided between the opening end 122a and the surface of the sealing material 400 and in the vicinity of the opening end 122a. In the present example, the side surface 34 is provided so as to be in contact with the opening end 122*a*. Here, the phrase "provided so as to be in contact with" refers to, as one example, that the distance from the opening end is in a range no less than 0 mm and no greater than 5.0 mm.

Furthermore, the dent portion 30 is continuously formed between the opening end 122*a* and the sealing material 400 over an area at least wider than the opening end 122*a*. In the present example, the dent portion 30 is continuously formed from one end of the inner wall 170 where the inner wall 170 is in contact with the outer wall 150 to the other end of the inner wall 170 where the inner wall 170 is in contact with the outer wall 160 over the width direction of the inner wall 170.

The dent portion 30 is, as one example, simultaneously formed with the case portion 100. In another example, the dent portion 30 is formed by cutting processing the case portion 100 after forming the case portion 100. In this case, the dent portion 30 may be formed before or after the sealing material 400 is enclosed.

Here, the end surface 36 is one example of a lower surface of the dent portion. The lower surface of the dent portion is a surface including the lowest part of the dent portion among the surfaces forming the dent portion. It should be noted that the lowest part of the dent portion is a portion of the dent portion 30 farthest from the wall portion where the dent portion is formed, in a direction parallel to the surface of the sealing material 400. In the present example, the depth d1 of the dent portion 30 is the distance from the surface of the inner wall 170 close to the sealing material 400 to the end surface 36. The depth d1 is, for example, in a range from 1.0 mm to 5.0 mm. For example, the lower limit of the depth d1 may be 2.0 mm or 3.0 mm.

Also, the dent portion 30 has a length L1. The length of the dent portion 30 is the length of the dent portion 30 in a direction from the sealing material 400 toward the opening end 122*a*. Here, the direction from the sealing material 400 toward the opening end 122*a* may be the gravitational direction (the direction in which the oil component flows) in a case where the semiconductor device 1000 is installed for use. As one example, the length of the dent portion 30 is the length by which a straight line along the gravitational direction is cut by the dent portion 30. In the present example, the length L1 is the distance on the end surface 36 between the side surface 32 and the side surface 34 in the cross sectional shape of the dent portion 30, that is, the distance on the end surface 36 from the intersection line between the end surface 36 and the side surface 32 to the intersection line between the end surface 36 and the side surface 34.

The amount of the oil component which can be stored in the dent portion 30 is adjustable in accordance with the length L1, the depth d1, and the width w1 the dent portion 30, the width w1 extending in the width direction of the wall portion. As one example, the length L1, the depth d1, and the width w1 that extends in the width direction of the wall portion of the dent portion 30 may be determined in accordance with the amount (weight or volume) of the used sealing material 400 or the amount (weight or volume) of the oil component included in the used sealing material 400.

In the present example, although the dent portion 30 is arranged such that the side surface 34 is in contact with the opening end 122*a*, the dent portion 30 may be arranged in any position as long as the position is between the opening end 122*a* and the surface 402 of the sealing material 400. For example, the dent portion 30 may be arranged at a position closer to the opening end 122*a* between the surface 402 of the sealing material 400 and the opening end 122*a*. In another example, the dent portion 30 may be arranged at a position closer to the surface 402 of the sealing material 400 between the sealing material 400 and the opening end 122*a*.

In this way, in the present example, by providing the dent portion 30 in the inner wall 170, the oil component can be stored in the room 180. For that reason, the oil component can be prevented from outflowing to the outside of the semiconductor device. Also, even if the oil component outflows, the outflow amount can be reduced.

In the present embodiment, the shape and the arrangement of the dent portion can be changed variously. The dent portion may be in any position, shape and/or size if the oil component flowing to the opening end can be stored. The width w1 of the dent portion 30 may be any width as long as the width is at least no less than the width of the opening end 122*a* in the dent portion. Also, the cross sectional shape of the dent portion 30 may be formed in a step shape ((A) in FIG. 9) a triangular shape whose vertex is arranged in the center ((B) in FIG. 9), a triangular shape whose vertex is arranged on the sealing material 400 side ((C) in FIG. 9), a triangular shape whose vertex is arranged on the opening end side ((D) in FIG. 9), a circular arc shape ((E) in FIG. 9) or a shape of a non-circular curve ((F) in FIG. 9), other than the rectangular shape shown in FIG. 8. Also, the dent portion may be formed in a combination of these multiple shapes.

Figure 9:
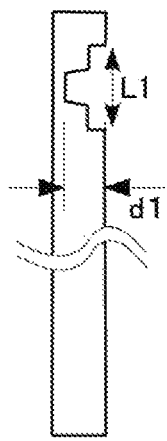
FIG. 9 shows a variation of a cross sectional shape of a dent portion 30.
Figure 9:
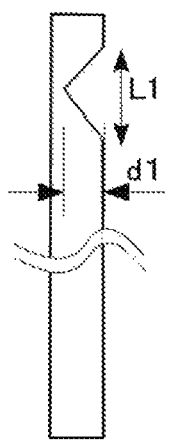
Figure 9:
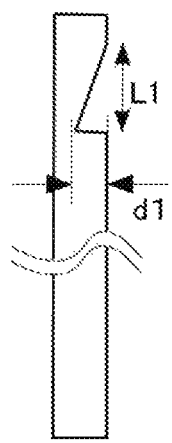
Figure 9:
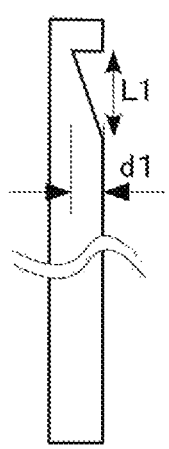
Figure 9:
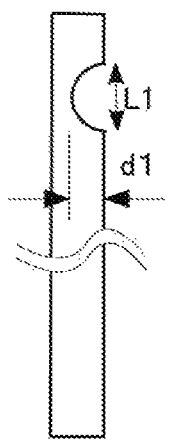
Figure 9:
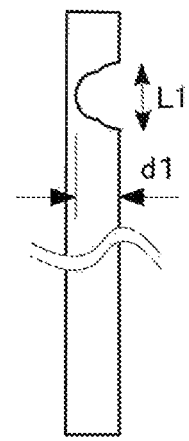

As one example, the dent portion as shown in (A) in FIG. 9 to (F) in FIG. 9 may be also arranged in multiple lines within the dent portion having a flat end surface (the end surface 36) as shown in FIG. 7 and FIG. 8. By further providing a plurality of dent portions within the dent portion, it is possible to make the oil component hardly flow toward the opening end. Also, the dent portion may be formed such that the size of its cross sectional shape changes along the extending direction of the dent portion.

Furthermore, a plurality of the dent portions may be formed in one wall portion. The plurality of the dent portions may be formed continuously connecting with each other or discontinuously independent from each other.

Third Example

Figure 10:
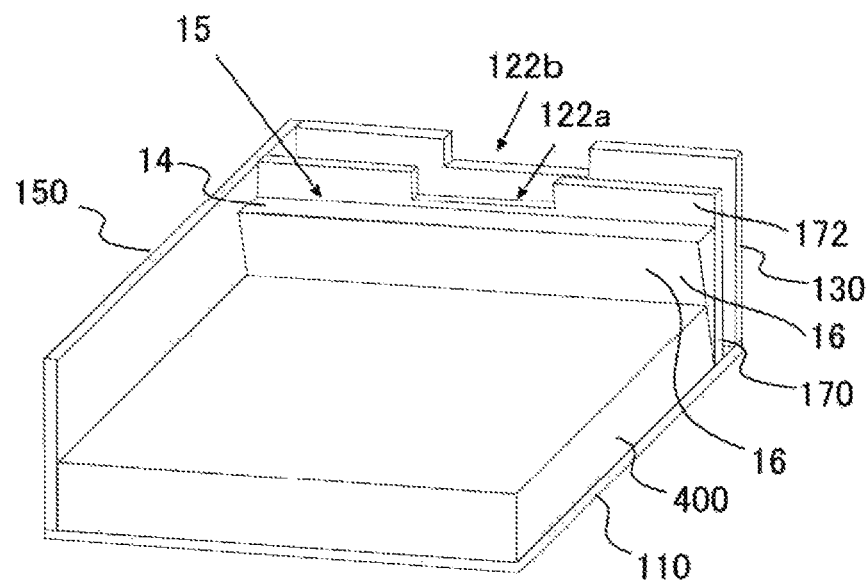
FIG. 10 shows a partial perspective view of the case portion 100 in a third example.
Figure 11:
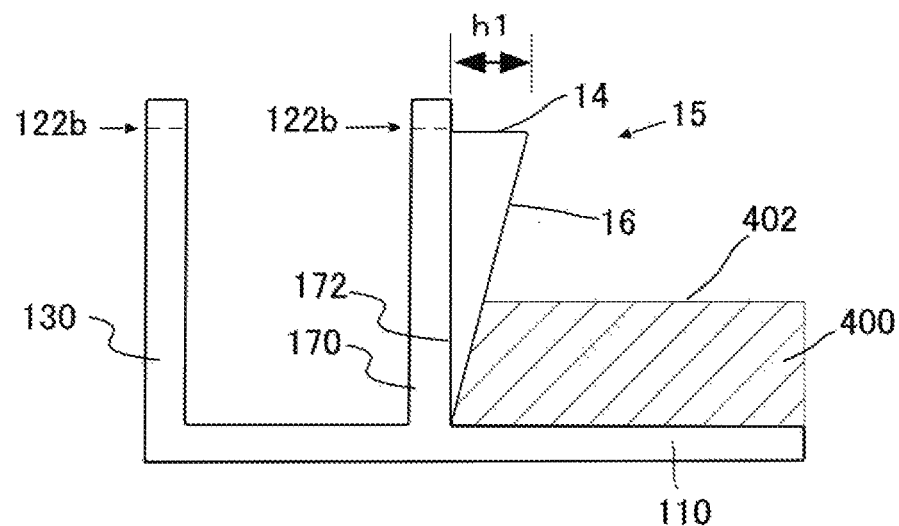
FIG. 11 shows a side view of FIG. 10.

In FIG. 10, a partial perspective view of the case portion 100 in a third example, where a projection portion 15 in another shape is provided on the inner wall 170 that is in contact with the sealing material 400, is shown. In FIG. 11, a side view of FIG. 10 is shown. It should be noted that in order to be easily understood, in FIG. 10, the upper wall 120 and the outer walls 140 and 160 are not shown. The structure of the case portion 100 in the present example is the same as the structure described in FIGS. 1 to 3, except the below-described point.

The projection portion 15 has the end surface 16 and a side surface 14 far away from the sealing material 400. The side surface 14 approximately perpendicularly connects to the surface 172 on the sealing material 400 side of the inner wall 170. The side surface 14 is positioned such that the intersection line between the side surface 14 and the surface 172 of the inner wall 170 is in contact with the opening end 122*a*. As described above, if the intersection line is provided within 5.0 mm from the opening end 122, the intersection line may be regarded as being in contact with the opening end 122.

In the present example, the end surface 16 ends at the intersection line between the inner wall 170 and the bottom wall 110. Also, the end surface 16 is formed to incline relative to the surface 172 of the inner wall 170 such that its height at a position from the surface of the inner wall 170 becomes larger as the distance between the position and the opening end 122a is shorter. In the present example, the end surface 16 has a fixed inclination angle. Also, the end surface 16 is one example of the protruding surface of the projection portion 15.

According to such a structure, the projection portion 15 is provided in the vicinity of the opening end 122a and the inclined end surface 16 of the projection portion 15 keeps the oil component stored in the room 180.

Figure 12:
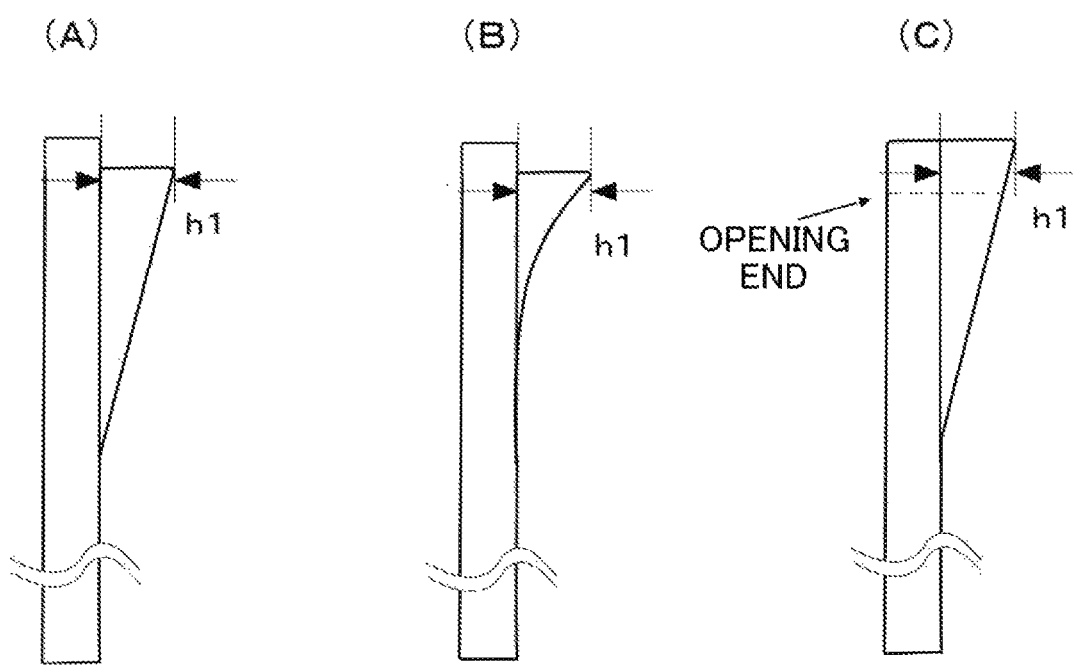
FIG. 12 shows a variation of a cross sectional shape of a projection portion 15.

Although the end surface 16 in the present example is continuously formed from the opening end to the bottom end of the wall portion (the intersection line for the bottom wall 110), the end surface 16 may end at a position on an upper side of the bottom end of the wall portion, as shown in (A) in FIG. 12 or (B) in FIG. 12.

Although each end surface 16 in the present example is formed as a flat surface having a fixed angle of inclination relative to the wall portions, the end surface 16 may be formed as a curved surface as shown in (B) in FIG. 12 or may be formed by a combination of a curved surface and a flat surface.

Also, in another example, the projection portion 15 may be formed beyond the opening end. As one example, the projection portion 15 may be formed from the respective upper end portions of the outer wall 130 and the inner wall 170 ((C) in FIG. 12). It should be noted that in this case a space for the engaging of the lid portion 200 may be formed in the projection portion 15.

Fourth Example

Figure 13:
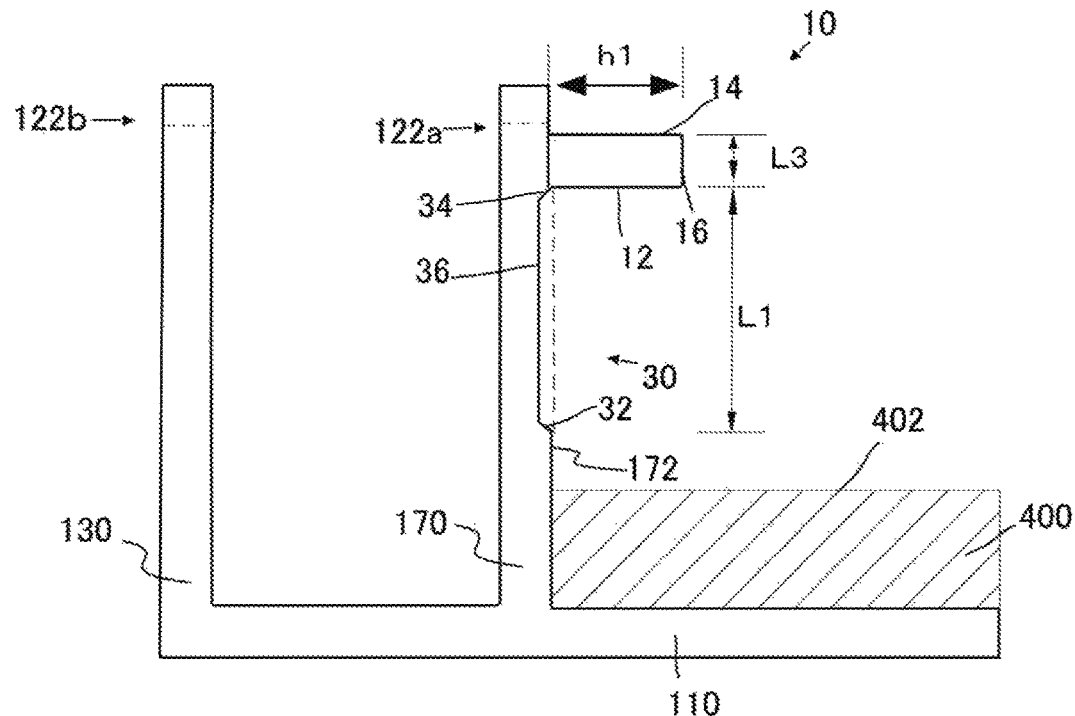
FIG. 13 shows a side view of the case portion 100 in a fourth example.
Figure 14A:
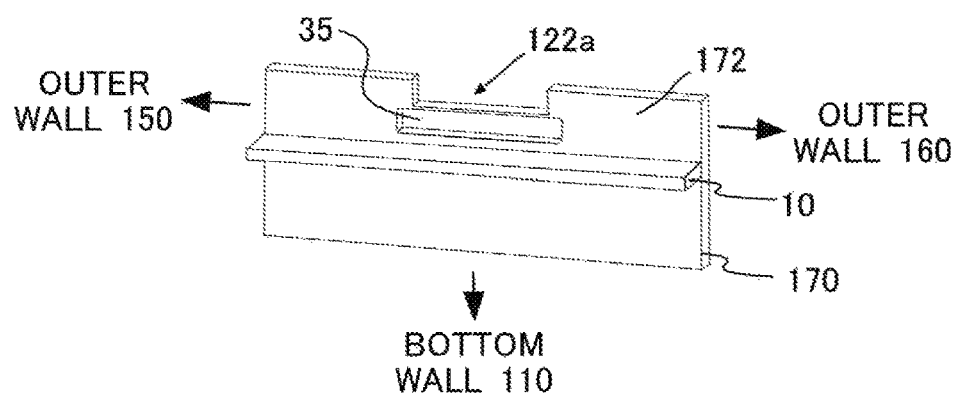
FIG. 14A shows a variation of the fourth example.
Figure 14B:
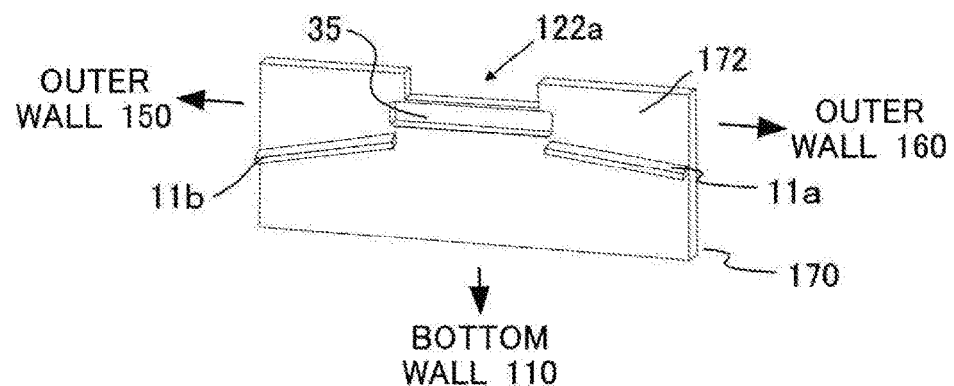
FIG. 14B shows a variation of the fourth example.

In FIG. 13, a side view of the case portion 100 in a fourth example, where both the projection portion 10 and the dent portion 30 are provided on the inner wall 170 that is in contact with the sealing material 400, is shown. The structure of the case portion 100 is the same as the structure described in FIGS. 1 to 3, except the below-described point. Also, the projection portion 10 in the present example has the same structure as that of the projection portion 10 described in FIGS. 4 and/or 5 (the first example), except the following point. Furthermore, the dent portion 30 of the present example has the same structure as that of the dent portion 30 described in FIGS. 7 and/or 8 (the second example), except the following point.

In the present example, the projection portion 10 is arranged so as to be in contact with the opening end 122a, and the dent portion 30 is arranged between the projection portion 10 and the sealing material 400. That is, the projection portion 10 is provided closer to the opening end 122a than the dent portion 30. According to such a configuration, the outflowed oil component is first stored in the dent portion 30. Also, even if the oil component overflows from the dent portion 30, the possibility that the oil component outflows to the outside can be reduced since the oil component can be dammed by the projection portion 10.

Also in the present example, the length L1 of the dent portion 30 is formed longer than the length L3 of the projection portion 10 in the direction from the sealing material 400 toward the opening end.

Here, the length L3 of the projection portion 10 is the length of the projection portion 10 in the direction from the sealing material 400 toward the opening end 122a. For example, the length L3 is the distance between the side surface 12 and the side surface 14 in the cross sectional shape of the projection portion 10.

According to the above-described configuration, since the volume that the projection portion occupies becomes relatively smaller and the volume for possible accumulation by the dent portion becomes relatively larger, the limited space can be utilized efficiently.

It is possible to variously change the numbers, the shapes and/or the arrangements of the projection portion and the dent portion as necessary. As one example, the dent portion may be provided at a position closer to the opening end than the projection portion. In an example shown in FIG. 14A, the dent portion 35 having approximately the same length as that of the opening end is provided so as to be in contact with the opening end 122a, and the projection portion 10 is provided between the dent portion 35 and the sealing material 400. It should be noted that a positional relationship among the outer walls 150 and 160 and the bottom wall 110 is shown by arrows in FIG. 14A.

In another example, a plurality of projection portions and a plurality of dent portions may be arrayed. In yet another example, the projection portion and the dent portion may be arranged so as to surround the opening end. In this case, the plurality of the projection portions and the dent portions may alternately surround the opening end.

Also, the structure combining the projection portion and the dent portion may be the structure to prevent the oil component from outflowing from the opening end, as a result. For example, the projection portion and the dent portion may be formed continuously as a whole over the width direction of the wall portion. In an example shown in FIG. 14B, the dent portion 35 having approximately the same length as that of the opening end is arranged in the surface 172 of the inner wall 170 so as to be in contact with the opening end 122a. A first projection portion 11a is continuously formed from the outer wall 150 (not shown) to the dent portion 35 and a second projection portion 11b is continuously formed from the dent portion 35 to the outer wall 160 (not shown). Also, the first projection portion and the second projection portion are arranged to incline relative to a direction in which the opening end 122a extends. Thereby, the flow of the oil component can be appropriately led to the dent portion.

In the above, although the form where the projection portion or the dent portion is provided on the inner wall 170 as the wall portion in contact with the sealing material has been described, at least one of the other wall portions (the outer walls 140, 150 and 160) being in contact with the sealing material may be provided with the projection or dent portion.

Figure 15:
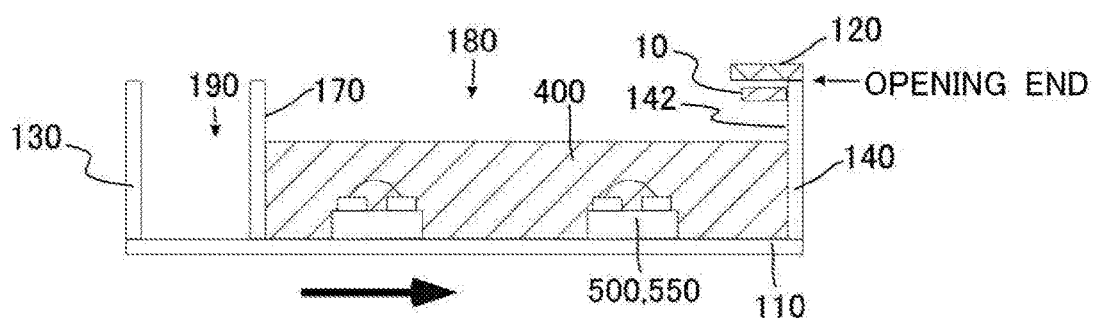
FIG. 15 shows a variation of the first example.
Figure 16:
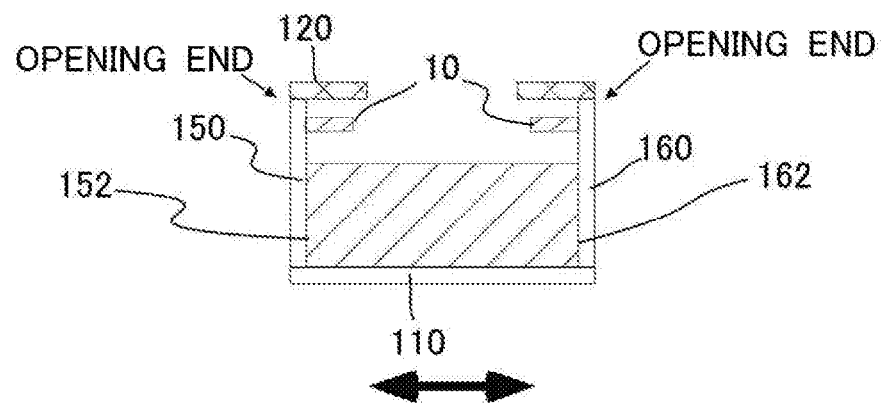
FIG. 16 shows another variation of the first example.

As a variation of the first example, in FIG. 15, an example that the projection portion 10 is provided on the surface 142 of the outer wall 140 close to the sealing material 400 is shown. In FIG. 15, a part of the upper wall 120 close to the outer wall 140 is shown and the other parts are omitted. Also, as another variation of the first example, in FIG. 16, an example where the projection portions 10 are provided on the surface 152 of the outer wall 150 and the surface 162 of the outer wall 160 close to the sealing material 400 is shown. Depending on the products, in some cases the opening ends are formed between the bottom wall 110 and the outer wall 140, between the bottom wall 110 and the outer wall 150, or between the bottom wall 110 and the outer wall 160. In that case, by providing the projection portions 10 on the outer wall 140, the outer wall 150 and the outer wall 160, the outflow of the oil component can be prevented even if the semiconductor device 1000 is arranged such that any of the outer wall 140, the outer wall 150 and the outer wall 160 is placed in the vertical direction.

Figure 17:
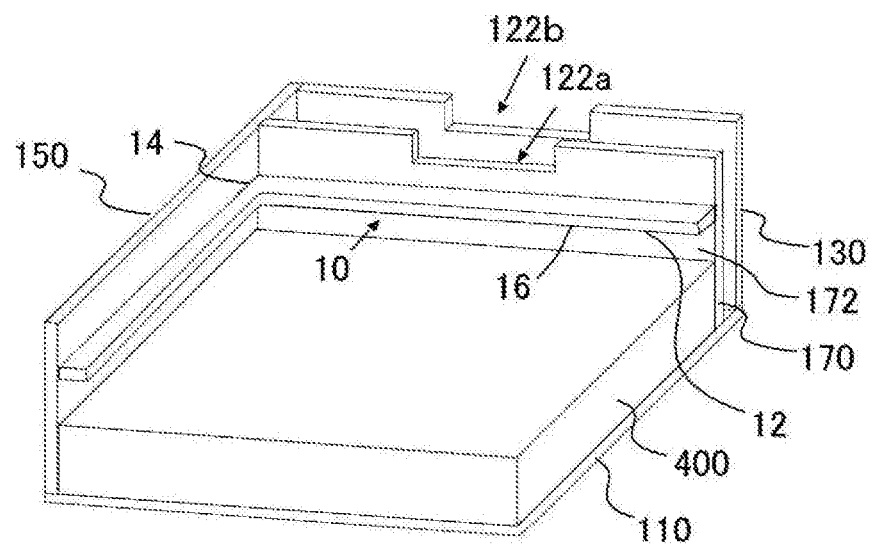
FIG. 17 shows still another variation of the first example.

Further, in the other variation of the first example, the projection portions 10 may be formed on a plurality of wall portions adjacent to each other. This condition is shown in FIG. 17 (the outer walls 140 and 160 are not shown). In the present example, the projection portions 10 are respectively provided on the outer walls 140, 150 and 160 and the inner wall 170, and a configuration is made where all of the projection portions 10 on the adjacent wall portions are continuous one after another. Thereby, even if the semiconductor device 1000 is arranged in various directions, the outflow of the oil component can be prevented or reduced.

It should be noted that although providing the projection portion 10 on a wall portion where the opening end is designed to be included is surely effective, in another example, the projection portion 10 may be arranged on a wall portion where no opening end is designed to be included. Thereby, the outflow of the oil component can be prevented even if the opening end is generated after manufacturing due to deterioration with age or damage during usage.

It should be noted that in this way, the second, third and fourth examples can be varied in the same manner such that the projection portions are differently positioned in the respective wall portions having the opening end.

The above has described, as the form where the projection portion or the dent portion is provided on the inner wall 170 that is in contact with the sealing material 400, the first example to the fourth example and their variations have been described. However, to prevent the outflow of the oil component, the projection portion 10 or the dent portion 30 may be provided on any of the wall portions if provided on a surface of the wall portion close to the sealing material 400 between the opening end 122 and the sealing material 400. Also, in that case, the projection portion 10 or the dent portion 30 may be provided on at least one of the wall portions. Then, the following will describe an embodiment where the projection portion or the dent portion is provided on a plurality of wall portions having the opening ends.

Fifth Example

Figure 18:
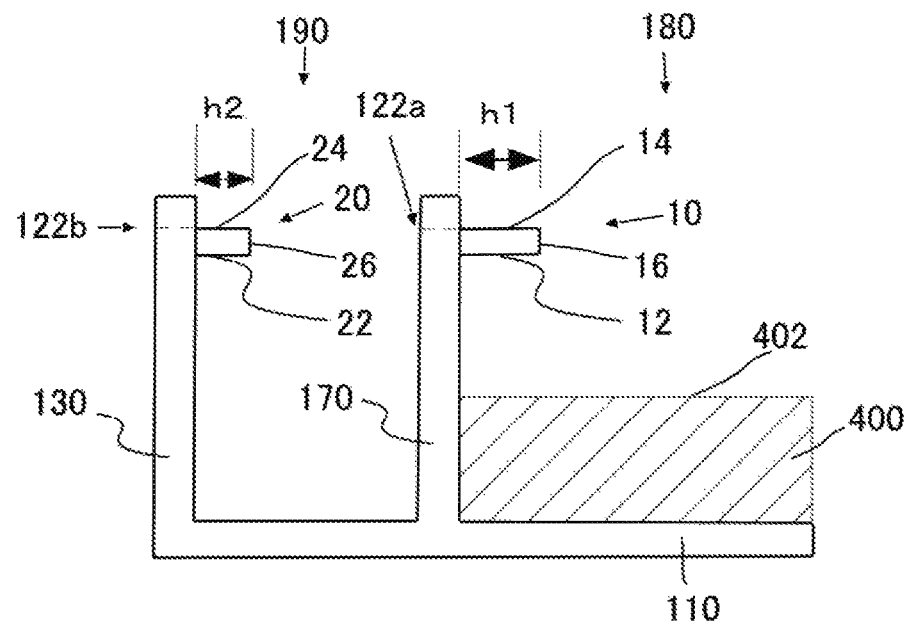
FIG. 18 shows a side view of the case portion 100 in a fifth example.

In FIG. 18, a side view of the case portion 100 in a fifth example, where the projection portions 10 and 20 are respectively provided on the inner wall 170 and the outer wall 130, is shown. In the present example, the projection portion 10 is provided on the inner wall 170 and the projection portion 20 is provided on the outer wall 130, respectively. The structure of the case portion 100 is the same as the structure described in FIGS. 1 to 3, except the below-described point. Also, since the configuration of the projection portion 10 is the same as the configuration described in FIG. 4 and FIG. 5, the description is omitted. Also, the projection portion 20 has a similar configuration to that of the projection portion 10, except the below-described point.

The projection portion 20 has a side surface 22 being a surface close to the sealing material 400, a side surface 24 facing away from the side surface 22 and an end surface 26 connecting the side surface 22 with the side surface 24.

In this way, in the present example, since two projection portions (the projection portion 10 and the projection portion 20) are provided, the leakage of the oil component can be securely prevented or reduced. Also, since the sealing material 400 is present in the room 180, the space therein to accumulate the oil component is relatively small compared to that in the room 190 in some cases. As one example, the height h1 of the projection portion 10 provided on the inner wall 170 is formed so as to be larger than the height h2 of the projection portion 20 provided on the outer wall 130.

Thereby, the amount of the oil component that can be stored can be increased in the room 180.

Also, in a case where the semiconductor device 1000 is used in such an environment that an acceleration occurs, since the liquid surface of the stored oil component inclines in accordance with the acceleration. Therefore, if the height of the projection portion is low, the outflow of the oil component occurs in some cases even if the amount does not exceed an allowable amount. On the other hand, according to the present example, by making the height of the projection portion on the wall portion close to the sealing material 400 larger, the outflow of the oil component can be suppressed.

Sixth Example

Figure 19:
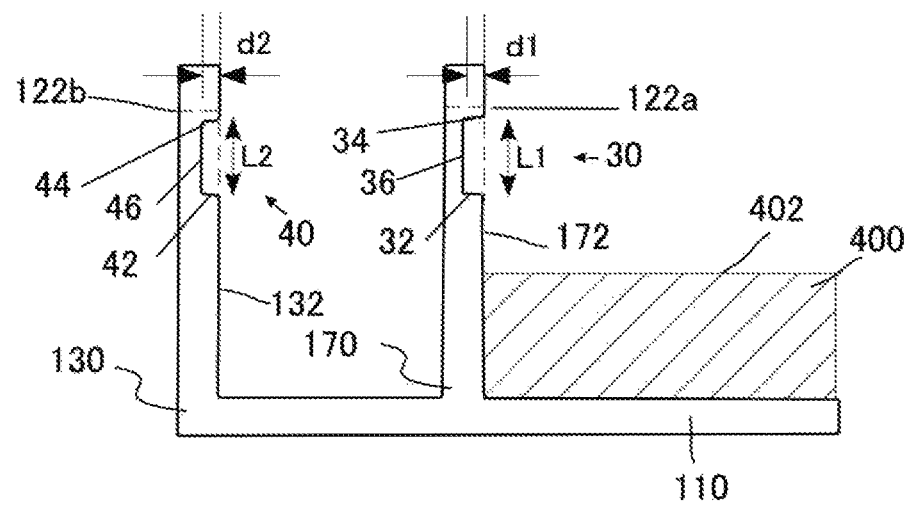
FIG. 19 shows a side view of the case portion 100 in a sixth example.

FIG. 19 shows a side view of the case portion 100 in a sixth example, where dent portions 30 and 40 are respectively provided in the inner wall 170 and the outer wall 130. The structure of the case portion 100 is the same as the structure described in FIGS. 1 to 3, except the below-described point. Also, since the configuration of the dent portion 30 is the same as the configuration described in FIGS. 7 and/or 8, the description is omitted. The dent portion 40 has a side surface 42 being a surface close to the sealing material 400, a side surface 44 being a surface far from the sealing material 400 and an end surface 46 connecting the both side surfaces. The dent portion 40 in the present example has a similar configuration to that of the dent portion 30, except the below-described point.

In the present example, the length L1 of the dent portion 30 and the length L2 of the dent portion 40 are approximately equal to each other, and the dent portion 30 and the dent portion 40 are formed such that the positions of the dent portion 30 and the dent portion 40 coincide with each other if seen from the direction parallel to the surface of the sealing material 400.

According to such a configuration, even if the oil component stored in the dent portion 30 leaks out from the dent portion 30, that oil component can be stored in the dent portion 40.

Further, in the present example, the depth d1 of the dent portion 30 is configured so as to be larger (that is, deeper) than the depth d2 of the dent portion 40. Thereby, the amount of the oil component that can be stored in the room 180 can be increased.

Seventh Example

Figure 20:
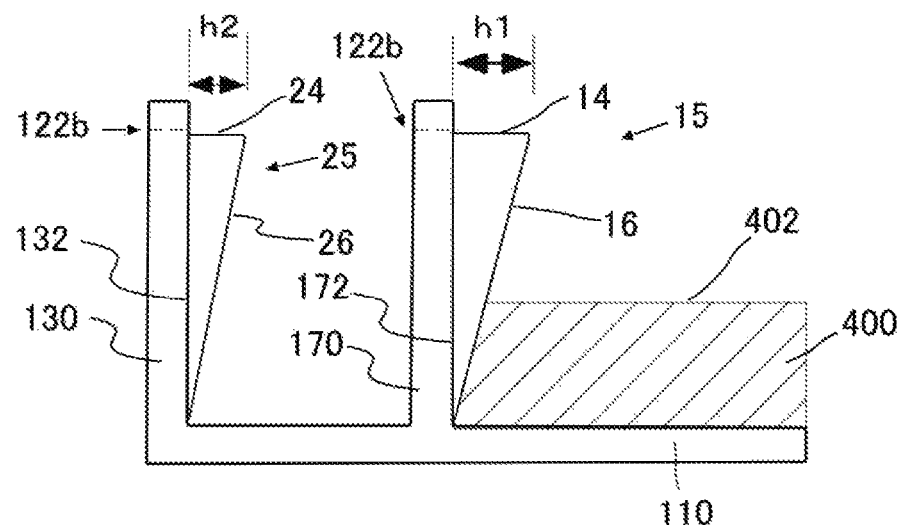
FIG. 20 shows a side view of the case portion 100 in a seventh example.

FIG. 20 shows a side view of the case portion 100 in a seventh example, where projection portions 15 and 25 are respectively provided on the inner wall 170 and the outer wall 130. The structure of the case portion 100 is the same as the structure described in FIGS. 1 to 3, except the below-described point. Since the configuration of the projection portion 15 is the same as the configuration described in FIGS. 10 and 11, the description is omitted. Also, the projection portion 25 in the present example has a similar configuration to that of the projection portion 15, except the below-described point.

The projection portion 25 has the end surface 26 and the side surface 24 far from the sealing material 400. The side surface 24 approximately perpendicularly connects with a surface 132 on the sealing material 400 side of the outer wall 130. The side surface 24 is formed at a position where the intersection line between the side surface 24 and the surface on the sealing material 400 side of the outer wall 130 is in contact with the opening end 122*b*. The end surface 26 ends at the intersection line between the outer wall 130 and the bottom wall 110.

The end surface 26 is formed to incline relative to the surface 132 of the outer wall 130 such that its height at a position from the surface of the outer wall 130 becomes larger as the distance between the position and the opening end 122*b* is shorter. In the present example, the end surface 26 has a fixed inclination angle. Also, the end surface 26 is one example of the protruding surface of the projection portion 25.

According to such a structure, even if the oil component stored in the room 180 leaks out from the room 180, that oil component can be further stored in the room 190 by the inclination that the end surface 26 of the projection portion 25 has.

Also, the inclination of the end surface 16 is formed so as to be larger than the inclination of the end surface 26. In other words, the height h1 of the projection portion 15 is larger than the height h2 of the projection portion 25. Thereby, a similar effect to that of the example described by using FIG. 13 can be obtained.

Eighth Example

Figure 21:
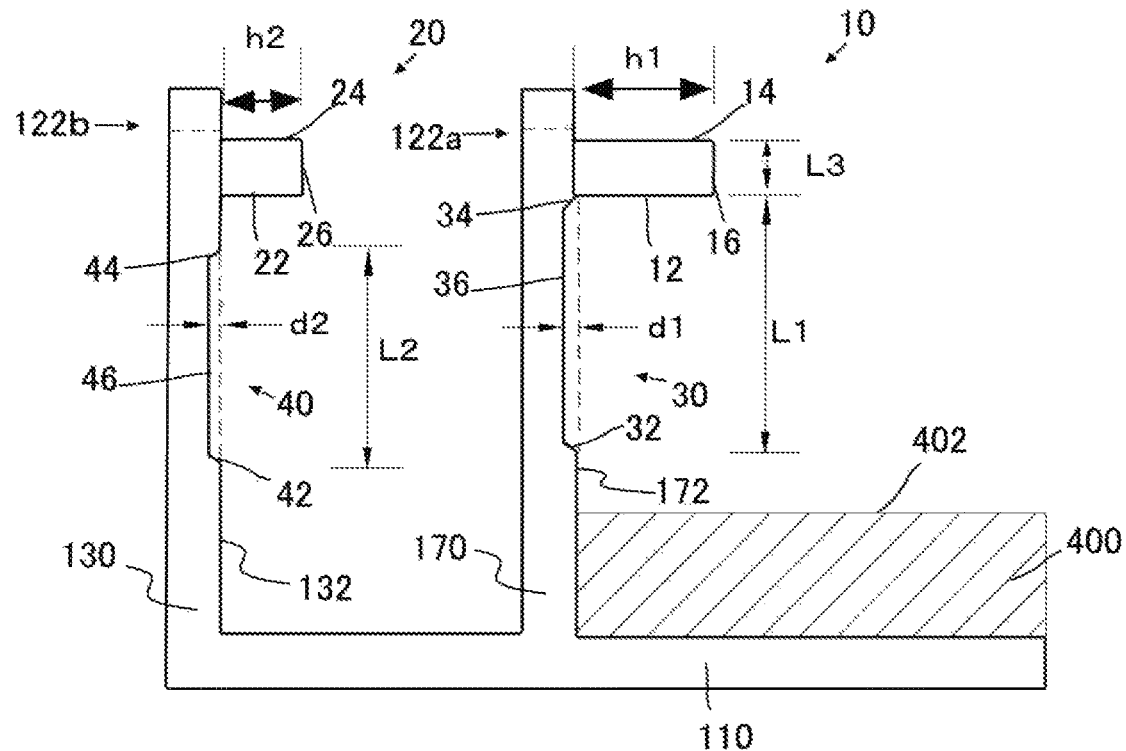
FIG. 21 shows a side view of the case portion 100 in an eighth example.

FIG. 21 shows a side view of the case portion 100 in an eighth example, where the projection portion 10 and the dent portion 30 are provided on the inner wall 170 and the projection portion 20 and the dent portion 40 are provided on the outer wall 130, respectively. The projection portion 10, the projection portion 20, the dent portion 30 and the dent portion 40 in the present example have the same structure as that of the projection portion 10 and the projection portion 20 described in FIG. 18 and that of the dent portion 30 and the dent portion 40 described in FIG. 20, except the following point.

In the present example, the dent portion 30 is arranged between the projection portion 10 and the sealing material 400, and the dent portion 40 are arranged between the projection portion 20 and the bottom wall 110. That is, the projection portion 10 is provided on the opening end 122*a* side of the dent portion 30, and the projection portion 20 is provided on the opening end 122*b* side of the dent portion 40.

According to such a configuration, the outflowed oil component is first stored in the dent portion 30 and is dammed by the projection portion 10 even if overflowing from the dent portion 30. Also, even if the oil component outflows from the projection portion 10, the oil component is stored in the dent portion 40 and is dammed by the projection portion 20, similarly. For that reason, the possibility that the oil component outflows to the outside can be significantly reduced.

Also, in the present example, the dent portion 30 is formed longer than the projection portion 10 in a direction from the sealing material 400 toward the opening end, and the dent portion 40 is formed longer than the projection portion 20. That is, the length L1 of the dent portion 30 is longer than the length L3 of the projection portion 10, and the length L2 of the dent portion 40 is longer than the length L4 of the projection portion 20.

According to the above-described configuration, since the volume that the projection portion occupies becomes relatively smaller and the volume for possible accumulation by the dent portion becomes relatively larger, the limited space can be utilized further efficiently than a case where the projection portion 10 and the dent portion 30 are provided on one wall portion.

As the above, although the form where the projection portion or the dent portion is provided on a plurality of wall portions has been exemplified by using FIG. 18 to FIG. 21, different types of projection portions or dents may be provided on different wall portions as a variation. For example, the projection portion 10 or the projection portion 15 may be provided on the inner wall 170 and the dent portion 30 may be provided on the outer wall 130, or the reversed arrangement may be made. Also, the dent portion may be provided closer to the opening end than the projection portion. Also, a plurality of projection portions or dent portions may be provided on one wall portion.

Ninth Example

Figure 22:
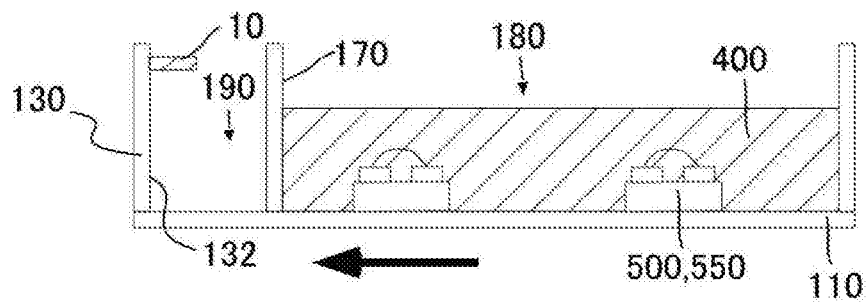
FIG. 22 shows a side view of the case portion 100 in a ninth example.

As described previously, to prevent the outflow of the oil component, the projection portion 10 or the dent portion 30 may be provided on at least one wall portion of the wall portions between the opening end 122 and the sealing material 400. In FIG. 22, a ninth example is shown, where the projection portion 10 is provided on a surface 132 of the outer wall 130 that is not in contact with the sealing material 400. The projection portion 10 is the same as the projection portion 10 described by using FIG. 4 to (G) in FIG. 6. Thereby, although the oil component flows from the room 180 to the room 190, the oil component is dammed by the projection portion 10 in the room 190 and the outflow to the outside can be prevented.

It should be noted that instead of the projection portion 10, at least one of the dent portions and the projection portions described by using FIG. 7 to FIG. 14B may be provided on the surface 132 of the outer wall 130.

Also, furthermore, at least one of the projection portions and the dent portions described by using FIG. 7 to FIG. 14B may be provided on either or both of the surface 152 of the outer wall 150 and the surface 162 of the outer wall 160. Further, in another example, the projection portion 10 or the dent portion 30 may be provided on all surfaces of the wall portions forming the case portion close to the sealing material 400. Thereby, even if any of the wall portions is arranged toward the vertical direction in the semiconductor device 1000, the outflow of the oil component can be prevented.

As the above, in the semiconductor device 1000 in the present embodiment, the form where the projection portion or the dent portion is provided on the wall portion to prevent the oil component from reaching the boundary surfaces between the lid portion 200 and the case portion 100. On the other hand, in some cases, the oil component outflows from the opening end of the wall portion in contact with the sealing material 400 beyond the projection portion or the dent portion. Also, in that case, the oil component drips in an unexpected direction sometimes. Then, the following describes an embodiment to prevent such a drip by providing a slope on a surface of the wall portion facing away from the sealing material and an embodiment to prevent such a drip by configuring to provide a liquid receiving portion to receive the oil component dripping from the opening end.

Tenth Example

Figure 23:
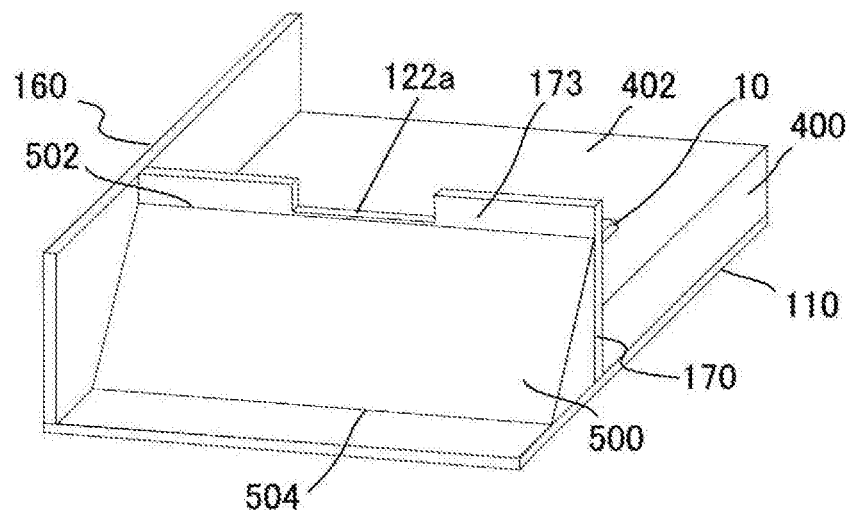
FIG. 23 shows a partial perspective view of the case portion 100 in a tenth example.
Figure 24:
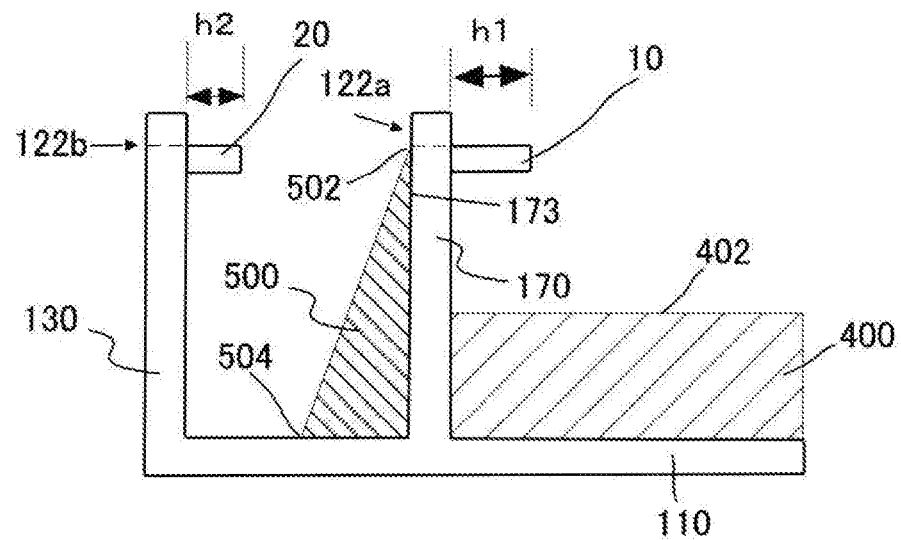
FIG. 24 shows a side view of FIG. 23.

FIG. 23 shows a partial perspective view of the case portion 100 in a tenth example, where an inclination is further provided on a surface 173 of the wall portion (the inner wall 170), which is facing away from the sealing material 400. In FIG. 24, a side view of FIG. 23 is shown. It should be noted that in order to be easily understood, in FIG. 23, the upper wall 120 and the outer walls 130, 140 and 150 are not shown. The case portion 100 in the present example is the same as the structure (the fifth example) shown in FIG. 18, except the below-described point.

In the present example, a slope 500 is further provided on the surface 173 which is facing away from the sealing material 400. In the slope 500, an end portion 502 of the slope 500 close to the opening end is in contact with the opening end 122a, and an end portion 504 that is facing away from the opening end 122a of the slope 500 connects with the bottom wall 110. In this case, the inclination is made relative to the surface close to the sealing material such that the thickness of at least a part of the inner wall 170 having the opening end 122a increases in accordance with the distance from the opening end 122a. In the present example, the slope 500 is formed such that the thickness of the wall portion is to be in direct proportion to the distance from the opening end 122 (that is, the angle of inclination becomes fixed). According to such a configuration, the oil component flowing from the opening end 122a can be led to the inside of the room 190 along the slope 500.

It should be noted that the end portion 502 of the slope 500 may be provided at a position separating from the opening end 122a. Also, the end portion 504 of the slope 500 may connect with the surface of the opposite outer wall 130, not connecting with the bottom wall 110. Also, the slope 500 may be a curved surface. In this case, the slope 500 may be recessed curved surface or may be a convex curved surface. Also, the slope 500 may have a plurality of flat surfaces. Also, furthermore, in another example, the slope 500 may be provided on both the inner wall 170 and the outer wall 130, or the slope 500 may be provided only on the outer wall 130.

Figure 25:
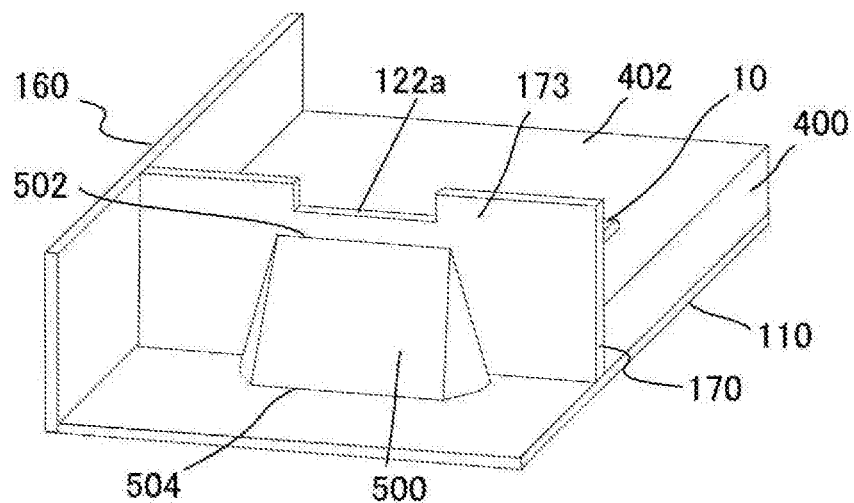
FIG. 25 shows a variation of the tenth example.

Although the slope 500 in the present example is formed over the whole width direction of the inner wall 170, the slope 500 may be formed so as to be at least larger than the opening end in the width direction of the inner wall 170 in another example. In an example shown in FIG. 25, the lengths of the end portion 502 and the end portion 504 are formed in approximately the same as the length of the opening end. Thereby, the volume that the inclination portion occupies in the room 190 is decreased and more oil component can be stored in the room 190.

It should be noted that although the slope 500 in the fifth example is provided in the examples shown in FIG. 23 and FIG. 24, such a slope 500 may be further provided in each of the other examples in FIG. 4 to FIG. 22 described previously.

Eleventh Example

Figure 26:
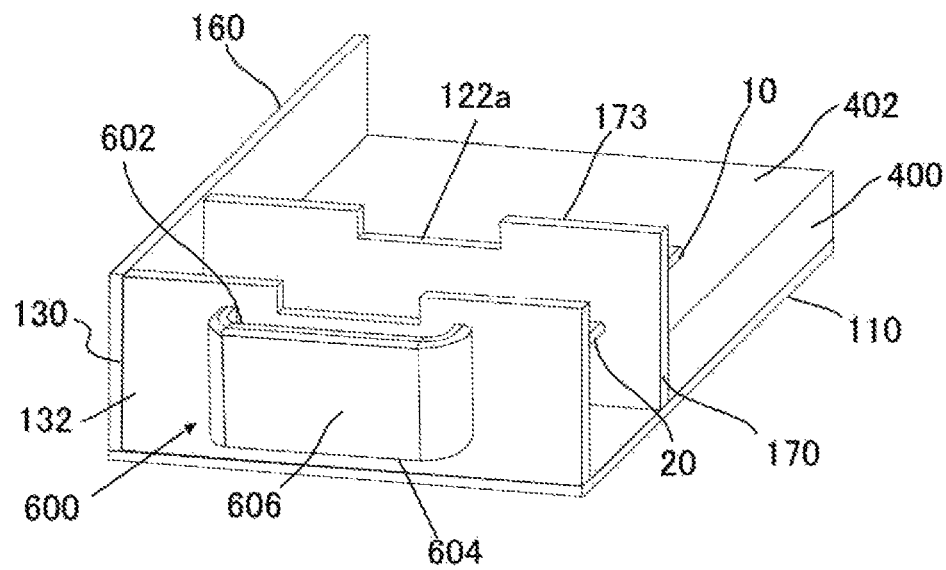
FIG. 26 shows a partial perspective view of the case portion 100 in an eleventh example.
Figure 27:
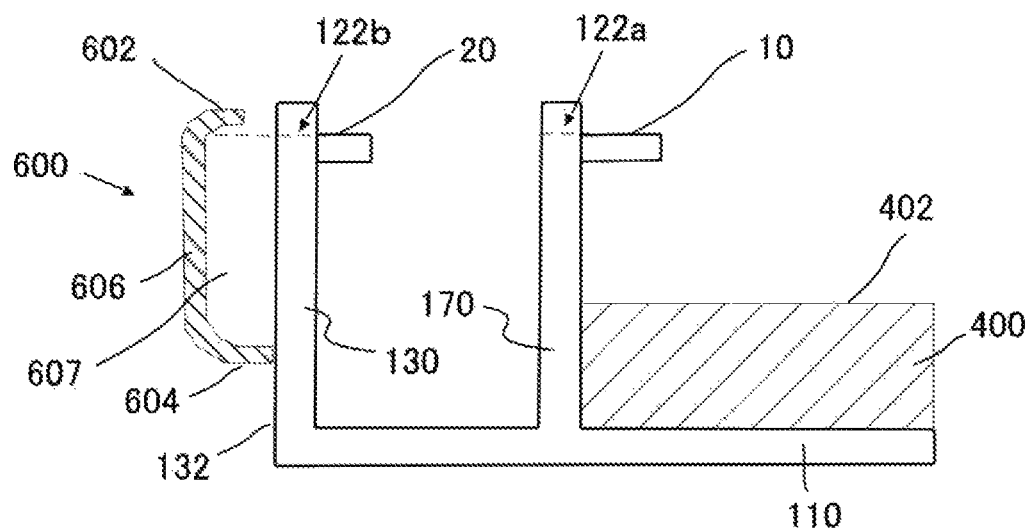
FIG. 27 shows a side view of FIG. 26.

In FIG. 26, a partial perspective view of the case portion 100 in an eleventh example, where a liquid receiving portion 600 is provided on the outer wall 130 having the opening end 122, is shown. In FIG. 27, a side view of FIG. 26 is shown. It should be noted that in order to be easily understood, in FIG. 27, the upper wall 120 and the outer walls 140 and 150 are not shown. In the present example, the liquid receiving portion 600 is provided in the fifth example described above.

The liquid receiving portion 600 has a main body portion 606 that is flat plate-shaped, a supporting part 604 that supports the main body portion 606 from the outer wall 130 and a protruding portion 602 that protrudes from a surface of the main body portion 606. In the present example, the supporting part 604 extends from three sides (one long side and two short sides) of the main body portion 606 and the protruding portion 602 extends from one side (the long side) of the main body portion 606 in a direction vertical to the surface of the main body portion 606. Also, the protruding portion 602 and the supporting part 604 are arranged to continuously surround the main body portion 606 and to extend in a direction separating from the surface of the main body portion 606. Thereby, a space 607 for accumulating the oil component is formed by the surface of the main body portion 606, the protruding portion 602 and the supporting part 604.

In the present example, at least a part of the main body portion 606 is provided facing away from the opening end 122b and the liquid receiving portion 600 is provided on the outer wall 130 by the supporting part 604. The liquid receiving portion 600 may be formed integrally with the outer wall 130 or may be installed on the outer wall 130 after forming the case portion 100.

As shown in FIG. 2, in a case where the lid portion 200 is of a structure to be slid and to engage with the case portion 100, the liquid receiving portion 600 is installed on the outer wall 130 after the lid portion 200 is inserted in the case portion 100. In that case, for example, the supporting part 604 in the present example has an engagement part and is installed on the outer wall 130 by engaging the engagement part with the outer wall 130. The engagement part may be, for example, one or more holes, grooves and/or projections. This engagement part may be of a detachable configuration. In another example, the liquid receiving portion 600 may be installed on the outer wall 130 by the adhesive. According to such a configuration, the oil component dripped from the opening end 122b can be received and the outflow from the semiconductor device to the outside can be prevented.

Also, in the present example, as shown in the drawing, the protruding portion 602 and the supporting part 604 are formed to be curved toward the outer side of the main body portion 606. Thereby, the volume for accumulating the oil component can be made larger. It should be noted that although in the present example the main body portion 606 is provided at the position facing away from the opening end, the protruding portion 602 may be facing away from the opening end. Also, in another example, the protruding portion 602 and the main body portion 606 may be formed in a plane shape.

Also in the present example, the protruding portion 602 does not connect with the outer wall 130 and a space 607 surrounded by the main body portion 606, the protruding portion 602, the supporting part 604 and the outer wall 130 is open toward the outside. By utilizing this open portion, a work for checking the presence of the oil leakage from the semiconductor device or a work for removing the stored oil component is possible. In another example, such an open space may not be provided between the protruding portion 602 and the outer wall 130.

In the present example, although the liquid receiving portion 600 is provided after mounting the lid portion 200 on the case portion 100, the liquid receiving portion 600 may have a structure that is movable relative to the outer wall 130 so as to prevent the liquid receiving portion 600 from interfering with the mounting of the lid portion 200. For example, the liquid receiving portion 600 may have a structure able to evacuate from an insertion path of the lid portion 200.

Figure 28:
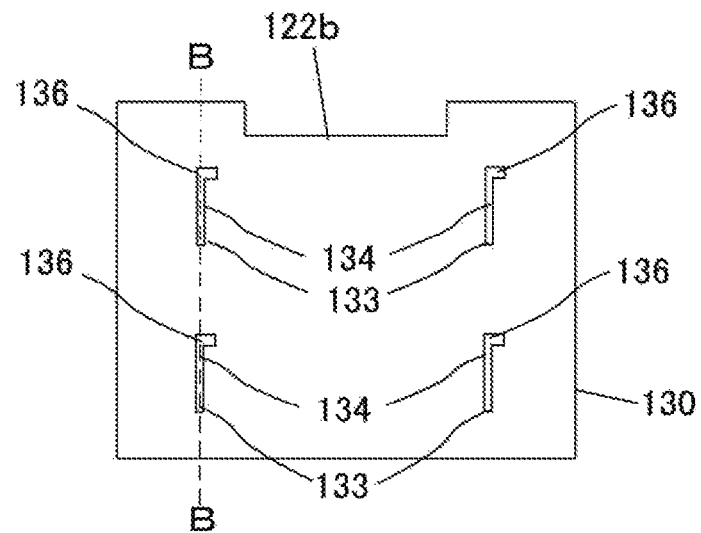
FIG. 28 shows another variation of the eleventh example.
Figure 29:
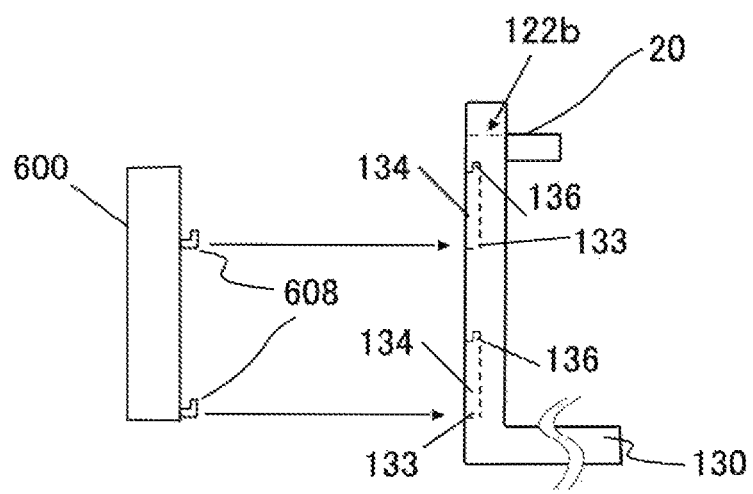
FIG. 29 shows another variation of the eleventh example.

In FIG. 28 and FIG. 29, other variations of the eleventh example are shown. In FIG. 28, the outer wall 130 is shown from a view where the liquid receiving portion 600 is provided. In FIG. 29, a condition that the liquid receiving portion 600 is installed on the outer wall 130 is shown.

An engagement hole 133 is provided on the outer wall 130 and a groove 134 extending from the engagement hole 133 in a direction from the bottom wall 110 to the upper wall 120 is provided in the outer wall 130. In the present example, the outer wall 130 has four engagement holes 133 and the four engagement holes 133 are provided in positions of vertexes that form an approximately rectangular. Locking parts 136 are respectively provided in end portions of the extending grooves 134. Engagement pins 608 are provided on the supporting part 604 of the liquid receiving portion 600. In the present example, four engagement pins 608 are provided on the supporting part 604 so as to be at a positional relationship corresponding to the four engagement holes 133.

In a case where the liquid receiving portion 600 is installed on the outer wall 130, the four engagement pins 608 are respectively inserted in the corresponding engagement holes 133 and the engagement pins 608 are moved along the grooves 134 in a direction from the bottom wall 110 toward the upper wall 120. Then, the locking parts 136 lock the engagement pins 608, and then the liquid receiving portion 600 is fixed. It should be noted that each of the four locking parts 136 in the present example has a groove extending in a direction approximately perpendicularly to the direction in which the groove 134 extends, and the liquid receiving portion 600 is fixed by moving the engagement pins 608 toward the groove direction. In this way, since the liquid receiving portion 600 is slid in the vertical direction, when installing or removing the lid portion 200, the liquid receiving portion 600 can be evacuated from the insertion path of the lid portion 200.

It should be noted that the engagement holes or the engagement pins are not limited to the exemplified numbers or structures. Also, the direction in which the groove 134 extends is set in accordance with the position and the shape of the opening end. For example, by providing the groove 134 so as to extend from the outer wall 150 to the outer wall 160, the liquid receiving portion 600 may be slid in a horizontal direction.

Figure 30:
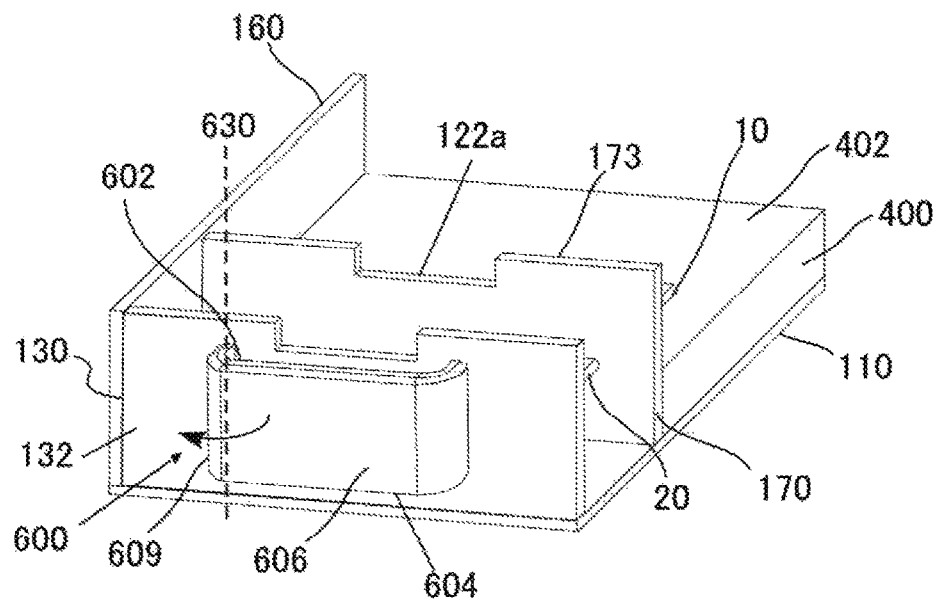
FIG. 30 shows still another variation of the eleventh example.

In FIG. 30, as still another variation of the eleventh example, an example that the liquid receiving portion 600 is rotatable relative to the bottom wall 110 is shown. In the present example, a rotating mechanism is provided on a portion of the supporting part 604 which extends from the short side of the main body portion 606 and contacts with the outer wall 130 and on a corresponding portion of the outer wall 130. The rotating mechanism is, for example, a hinge. Also, a fixing portion 609 for fixing the main body portion 606 on the outer wall 130 is provided on the portion of the supporting part 604 which extends from the other short side of the main body portion 606. Thereby, the liquid receiving portion 600 becomes movable toward the direction separating from the outer wall 130 along a rotating axis 630.

It should be noted that the rotating mechanism may be provided on a portion of the supporting part 604 which extends from the other short side or the long side of the main body portion 606.

It should be noted that in the above-described eleventh example although the liquid receiving portion 600 is provided in the fifth example, such a liquid receiving portion 600 may be further provided in each of the other examples in FIG. 4 to FIG. 22 described previously.

Twelfth Example

Figure 31:
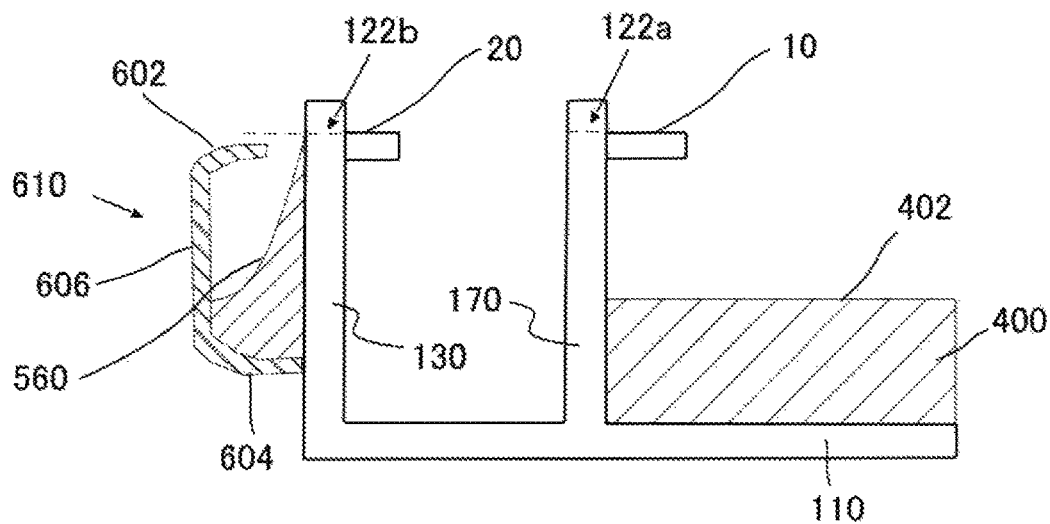
FIG. 31 shows a side view of the case portion 100 in a twelfth example.

In FIG. 31, a side view of the case portion 100 in a twelfth example, where the other liquid receiving portion 610 and slope 560 are included, is shown. The liquid receiving portion 610 has a similar configuration to that of the liquid receiving portion 600 described in FIGS. 27 and 28, except the below-described point.

Although in the examples shown in FIG. 26 and FIG. 27 at least a part of the main body portion 606 is provided at the position facing away from the opening end 122b in order to receive the oil component dripping from the opening end, in the present example, the end portion of the protruding portion 602 is provided close to the bottom wall 110 than the opening end 122b. For this reason, the installing or the removing of the lid portion 200 can be performed even after installing the liquid receiving portion 610 on the outer wall 130.

On the other hand, the oil component dripping from the opening end 122b does not appropriately drip to the main body portion 606 in some cases. Then, in the present example, the slope 560 has been provided on a surface facing away from the sealing material on the outer wall 130. It should be noted that the slope 560 has similar function and/or configuration to those of the slope 500 described by using FIG. 24 to FIG. 26. Accordingly, by leading the oil component outflowing beyond the opening end 122b along the slope 560 toward the liquid receiving portion 610, the oil component can be prevented from outflowing to the outside of the device.

As the above, the first embodiment of the semiconductor device 1000 where the projection portion or the dent portion is provided on the wall portion in order to prevent the oil component from outflowing has been described by using FIG. 1 to FIG. 31. Also, in a second embodiment, the semiconductor device 1000 does not have the projection portion and the dent portion and has the liquid receiving portion. Even in such a configuration, the oil component can be prevented from outflowing.

Second Embodiment

Figure 32:
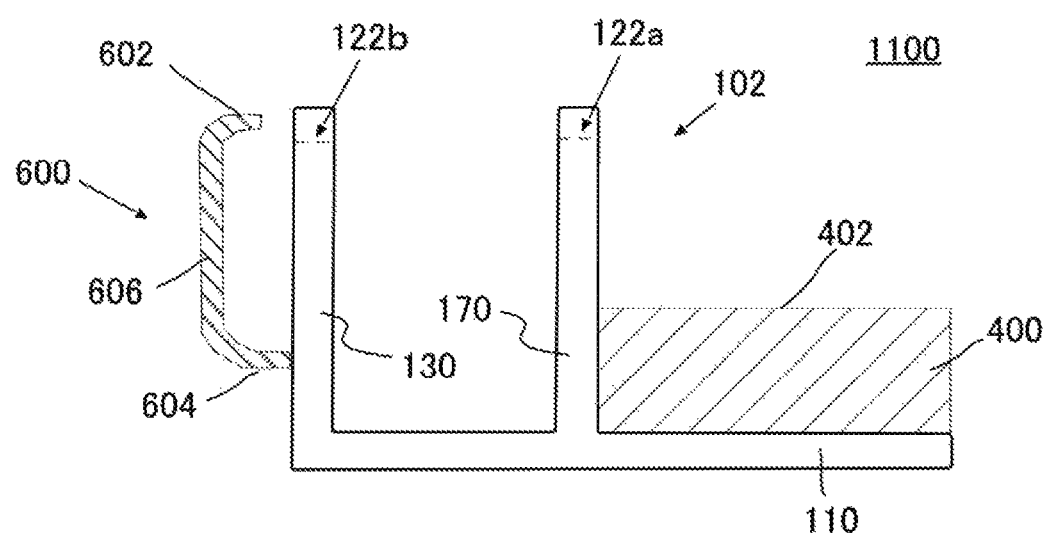
FIG. 32 shows a side view of a case portion 102 in a second embodiment.

FIG. 32 is a drawing showing a side view of a case portion 102 in a second embodiment. The case portion 102 included in a semiconductor device 1100 in the second embodiment has the same configuration and function as those of the case portion 100 described in the first embodiment, except that the projection portion and the dent portion are not included. Furthermore, the case portion 102 includes the liquid receiving portion 600 on the outer wall 130 which has the opening end 122. According to the configuration, even if the projection portion or the dent portion cannot be arranged inside the case portion 102, the outflow of the oil component can be prevented or reduced by the easy change.

As described in the above embodiment, by providing the projection portion, the dent portion or the liquid receiving portion on the wall portion of the case portion of the semiconductor device, even if a semiconductor device is arranged vertically, the component leached from the sealing material can be prevented from outflowing to the outside of the product without a large increase of the cost. Thereby, the stain surrounding the product can be prevented and the damage of the neighboring electronic circuits and the like can be prevented.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

It should be noted that the terms "upper" and "lower" in the claims or the specification refers to directions reversed to each other. However, the term "upper" is not limited to the direction reversing to the gravitational direction. Also, the term "lower" is not limited to the gravitational direction. Unless otherwise explicitly designated specifically, the directions described in the claims and the specification is not on the basis of the gravitational direction.

EXPLANATION OF REFERENCES 10, 20 . . . projection portion, 30 . . . dent portion, 100 . . . case portion, 110 . . . bottom wall, 120 . . . upper wall, 130, 140, 150, 160 . . . outer wall, 122a, 122b . . . opening end, 170 . . . inner wall, 180, 190 . . . room, 200 . . . lid portion, 300 . . . base portion, 400 . . . sealing material, 550 . . . semiconductor element, 600 . . . liquid receiving portion, 1000 . . . semiconductor device, 2000 . . . wall of an electrical device.

What is claimed is:

1. A semiconductor device comprising:
a semiconductor element;
a case portion that houses the semiconductor element and has an opening end on at least a part of a wall portion thereof;
a lid portion that covers the opening end of the case portion; and
a sealing material that seals the semiconductor element inside the case portion, wherein
a projection portion or a dent portion is provided on a surface of the wall portion directly between the opening end and the sealing material, the surface facing the sealing material.

2. The semiconductor device according to claim 1, wherein
the projection portion or the dent portion is provided on the wall portion that is in contact with the sealing material.

3. The semiconductor device according to claim 1, wherein
the projection portion is provided on the wall portion, and
a protruding surface of the projection portion inclines such that a height of the protruding surface from a surface of the wall portion at a position becomes larger as a distance between the position and the opening end becomes shorter.

4. The semiconductor device according to claim 1, wherein
the projection portion and the dent portion are provided on the wall portion.

5. The semiconductor device according to claim 4, wherein
the projection portion is provided closer to the opening end than the dent portion.

6. The semiconductor device according to claim 4, wherein
the dent portion is longer than the projection portion in a direction from the sealing material toward the opening end.

7. The semiconductor device according to claim 1, wherein
a surface of the wall portion, the surface that faces away from the sealing material, inclines relative to the surface facing the sealing material such that a thickness of at least a part of the wall portion having the opening end increases in accordance with a distance from the opening end.

8. The semiconductor device according to claim 1, wherein
the case portion has:
the wall portion as a first wall portion that is in contact with the sealing material and has the opening end and
a second wall portion that is provided on an outer side of the first wall portion and has a second opening end, and wherein
the projection portion or the dent portion is a first projection portion or a first dent portion, respectively, that is provided on the first wall portion, and
a second projection portion or a second dent portion is provided on the second wall portion.

9. The semiconductor device according to claim 8, wherein
a height of the first projection portion or a depth of the first dent portion provided on the first wall portion is greater than a height of the second projection portion or a depth of the second dent portion provided on the second wall portion.

10. The semiconductor device according to claim 8, wherein
the first projection portion is provided on the first wall portion,
the second projection portion is provided on the second wall portion
a first protruding surface of the first projection portion on the first wall portion inclines such that a height of the protruding surface at each position from a surface of the first wall portion becomes larger as each distance between each position and the opening end is shorter,
a second protruding surface of the second projection portion on the second wall portion inclines such that a height of the second protruding surface at each position from a surface of the second wall portion becomes larger as each distance between each position and the second opening end is shorter, and
an inclination of the protruding surface of the first projection portion on the first wall portion is larger than an inclination of the second protruding surface of the second projection portion on the second wall portion.

11. The semiconductor device according to claim 1, further comprising:
a liquid receiving portion that receives a liquid dripping from the opening end on a surface of the wall portion that has the opening end, the surface facing away from the sealing material.

12. The semiconductor device according to claim 11, wherein
the liquid receiving portion attachable to and detachable from the wall portion.

13. An electrical device provided with the semiconductor device according to claim 1 such that the opening end is positioned lower than at least a part of the sealing material.

14. The semiconductor device according to claim 1, wherein
a width of the projection portion or the dent portion is larger than a width of the opening end.

15. A semiconductor device comprising:
a semiconductor element;
a case portion that houses the semiconductor element and has an opening end on at least a part of a wall portion thereof;

a lid portion that covers the opening end of the case portion; and a sealing material that seals the semiconductor element inside the case portion, wherein a liquid receiving portion that receives a liquid dripping from the opening end is provided on a surface of the wall portion having the opening end, the surface facing away from the sealing material.

\* \* \* \* \*